(12) United States Patent
Moghaddam et al.

(10) Patent No.: US 12,127,430 B2
(45) Date of Patent: Oct. 22, 2024

(54) MICRO-OLED DISPLAY MODULE THERMAL MANAGEMENT

(71) Applicant: Meta Platforms Technologies, LLC, Menlo Park, CA (US)

(72) Inventors: Giti Karimi Moghaddam, Saratoga, CA (US); Douglas Moskowitz, Bellevue, WA (US); Kyung Won Park, Bellevue, WA (US); Ryan Fleming, Oakland, CA (US); Alexander Klement, Kenmore, WA (US); Donghee Nam, San Jose, CA (US); Yi-Chen Kuo, Santa Clara, CA (US); Mark Shintaro Ando, Seattle, WA (US)

(73) Assignee: Meta Platforms Technologies, LLC, Menlo Park, CA (US)

(*) Notice: Subject to any disclaimer, the term of this patent is extended or adjusted under 35 U.S.C. 154(b) by 387 days.

(21) Appl. No.: 17/589,872

(22) Filed: Jan. 31, 2022

(65) Prior Publication Data

US 2023/0247861 A1 Aug. 3, 2023

(51) Int. Cl.
*H05K 1/00* (2006.01)
*H01L 25/18* (2023.01)
(Continued)

(52) U.S. Cl.
CPC ............ *H10K 50/87* (2023.02); *H01L 25/18* (2013.01); *H05K 1/0204* (2013.01); *H05K 1/189* (2013.01);
(Continued)

(58) Field of Classification Search
CPC ...... G10K 50/87; H01L 25/18; H05K 1/0204; H05K 1/189; H05K 7/20972;
(Continued)

(56) References Cited

U.S. PATENT DOCUMENTS

| 9,456,525 B2 | 9/2016 | Yoon et al. |
| 10,466,740 B2 | 11/2019 | Miller et al. |

(Continued)

FOREIGN PATENT DOCUMENTS

| CN | 206096637 U | 4/2017 |
| CN | 106646871 A | 5/2017 |

(Continued)

OTHER PUBLICATIONS

Non-Final Office Action mailed Dec. 6, 2023 for U.S. Appl. No. 17/589,876, filed Jan. 31, 2022, 19 pages.
(Continued)

*Primary Examiner* — Zhengfu J Feng
(74) *Attorney, Agent, or Firm* — Greenberg Traurig, LLP

(57) ABSTRACT

A device includes a micro-organic light emitting diode (μ-OLED) display panel and an electronic component. An electrical connector electrically couples the μ-OLED display panel and the electronic component. A standoff is disposed between the electronic component and the μ-OLED display panel. The standoff physically couples the electronic component and the μ-OLED display panel with a gap therebetween. The gap thermally decouples the electronic component from the μ-OLED display panel. A U-shaped heat sink can be disposed in the standoff, and heat generated by the μ-OLED display can be mitigated by a system fan when a U-shaped heat sink is disposed in the standoff.

20 Claims, 15 Drawing Sheets

(51) Int. Cl.
    *H05K 1/02*     (2006.01)
    *H05K 1/18*     (2006.01)
    *H05K 7/20*     (2006.01)
    *H10K 50/87*     (2023.01)

(52) U.S. Cl.
    CPC ....... *H05K 7/20972* (2013.01); *H05K 7/2099* (2013.01); *H05K 2201/056* (2013.01); *H05K 2201/10128* (2013.01); *H05K 2201/10159* (2013.01); *H05K 2201/2036* (2013.01)

(58) Field of Classification Search
    CPC ........... H05K 7/2099; H05K 2201/056; H05K 2201/10128; H05K 2201/10159; H05K 2201/2036
    USPC ........................................................ 361/697
    See application file for complete search history.

(56) References Cited

U.S. PATENT DOCUMENTS

| | | | |
|---|---|---|---|
| 11,262,822 | B1 | 3/2022 | North et al. |
| 11,716,829 | B1 * | 8/2023 | Tan .................... H05K 7/20136 |
| | | | 361/697 |
| 2003/0196779 | A1 | 10/2003 | Horng et al. |
| 2005/0175838 | A1 | 8/2005 | Greinke et al. |
| 2006/0232919 | A1 | 10/2006 | Jeong |
| 2011/0013114 | A1 | 1/2011 | Dunn et al. |
| 2016/0365027 | A1 | 12/2016 | Suh |
| 2017/0184863 | A1 | 6/2017 | Balachandreswaran et al. |
| 2019/0075689 | A1 | 3/2019 | Selvakumar et al. |
| 2019/0104650 | A1 | 4/2019 | Mcginty et al. |
| 2019/0269037 | A1 | 8/2019 | Hill et al. |
| 2020/0337185 | A1 | 10/2020 | Choi et al. |
| 2021/0033916 | A1 | 2/2021 | Uchimi et al. |
| 2021/0064090 | A1 | 3/2021 | Wen et al. |
| 2021/0173456 | A1 | 6/2021 | Kulkarni et al. |
| 2021/0185855 | A1 | 6/2021 | Maric et al. |
| 2021/0303024 | A1 | 9/2021 | Kuo et al. |
| 2021/0325680 | A1 * | 10/2021 | Maric ................. G02B 27/0176 |
| 2021/0373592 | A1 * | 12/2021 | Maric ................. G02B 27/0176 |
| 2022/0046833 | A1 * | 2/2022 | Bai .................... H05K 7/20972 |
| 2022/0158119 | A1 | 5/2022 | Aurongzeb et al. |
| 2023/0066801 | A1 | 3/2023 | Lin et al. |
| 2023/0247811 | A1 | 8/2023 | Moghaddam |
| 2023/0276595 | A1 | 8/2023 | Moghaddam |
| 2023/0280596 | A1 * | 9/2023 | Ogawa ............... G02B 27/0176 |
| | | | 359/630 |

FOREIGN PATENT DOCUMENTS

| | | |
|---|---|---|
| CN | 207440398 U | 6/2018 |
| CN | 109445100 A | 3/2019 |
| CN | 213042193 U | 4/2021 |
| CN | 113031273 A | 6/2021 |
| EP | 2801888 A2 | 11/2014 |
| WO | 9940500 A2 | 8/1999 |
| WO | 2019000556 A1 | 1/2019 |

OTHER PUBLICATIONS

International Search Report and Written Opinion for International Application No. PCT/US2023/011935, mailed Apr. 28, 2023, 10 pages.

International Search Report and Written Opinion for International Application No. PCT/US2023/011940, mailed Apr. 28, 2023, 12 pages.

International Search Report and Written Opinion for International Application No. PCT/US2023/011945, mailed May 3, 2023, 10 pages.

* cited by examiner

MICRO-OLED DISPLAY MODULE THERMAL MANAGEMENT

BACKGROUND

Recent advancements of extended-reality headsets include the implementation of Micro Organic Light Emitting Diode (μ-OLED) display panels. These μ-OLED display panels provide the headsets with improved optical benefits compared to traditional micro display panels. Micro-OLED display panels will degrade at operating temperatures above 40° C., which is much lower than the operating temperature of the components surrounding the μ-OLED display panels. As such, the temperature of the μ-OLED display panels is typically managed through heat management systems that draw heat away from the μ-OLED display panels.

Existing heat management systems take up significant space, add weight, and are not well suited for use in extended-reality headsets.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
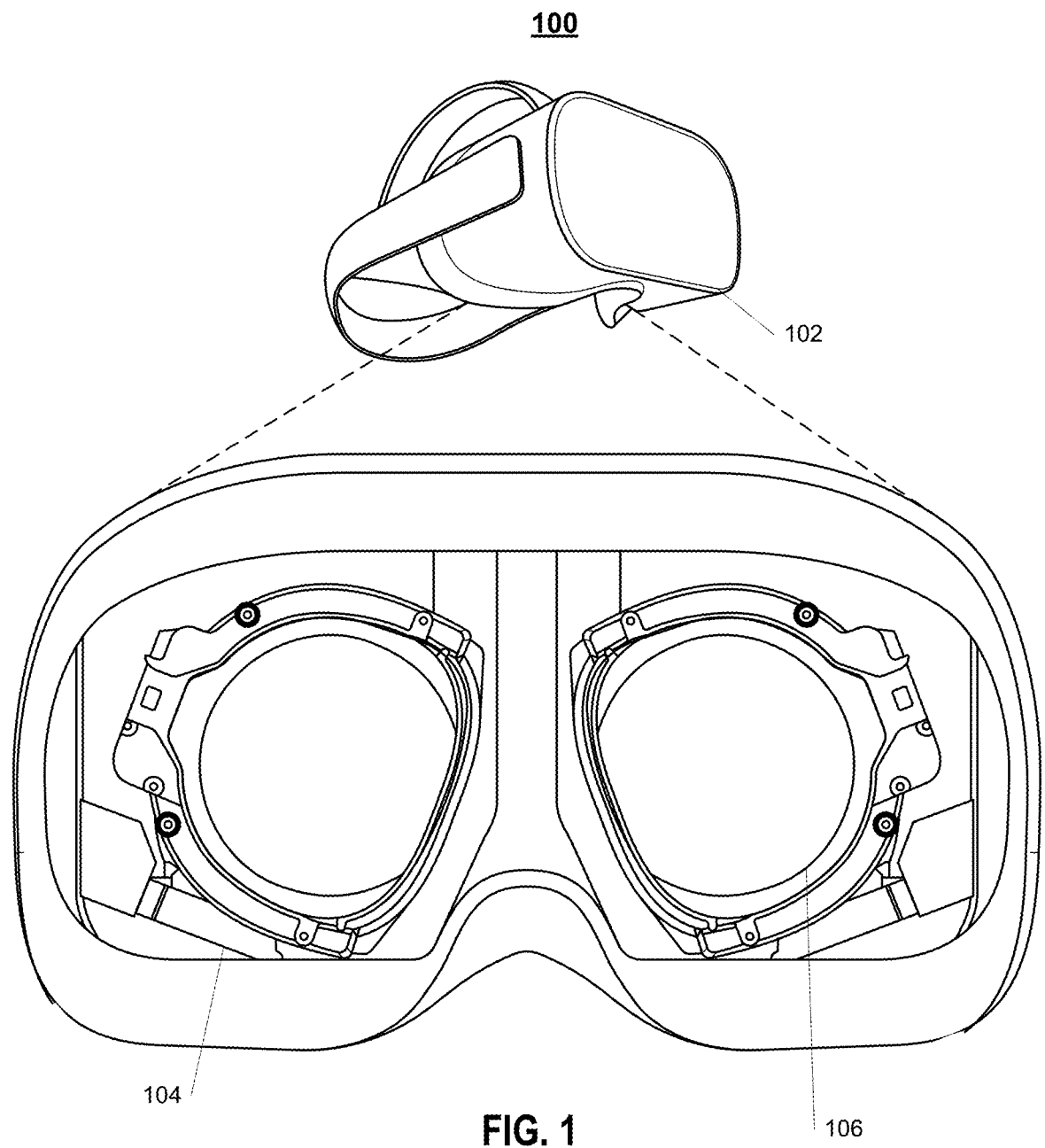
FIG. 1 illustrates a perspective view and a user's point of view of an example headset device including a thermal management system in accordance with an example of the present disclosure.

This application describes a thermal management system (TMS) for managing a temperature of an electronic device including a micro-organic light emitting diode (μ-OLED) display panel. The TMS can be configured to manage a temperature of components of the electronic device while also providing structural support to the electronic device. The TMS can be configured to manage a temperature of components of the electronic device while also providing protection to the various components of the electronic device. For example, the TMS can be configured to draw thermal energy directly from the μ-OLED display panel and/or other electronic component(s) of an electronic device in order to reduce a temperature of the μ-OLED display panel.

In some examples, the TMS can be used in electronic devices such as, but not limited to, a head-mounted device (e.g., an electronic headset-type device, an electronic visor-type device, an electronic glasses-type device, etc.) and other wearable devices. Head-mounted devices are referred to herein as "headsets" and can include extended-reality headsets that can allow users to view, create, consume, and/or share media content. In some examples, the headset can include a display structure having a display which is placed over eyes of a user and allows the user to "see" an extended reality. As discussed further below, the term "extended reality" or "extended-reality" includes virtual reality, mixed reality, and/or augmented reality.

As used herein, the term "virtual environment" or "extended-reality environment" refers to a simulated environment in which users can fully or partially immerse themselves. For example, an extended-reality environment can include a virtual-reality environment, an augmented-reality environment, a mixed-reality environment, etc. An extended-reality environment can include physical and/or virtual objects and elements with which a user can interact. In many cases, a user participates in an extended-reality environment using a computing device, such as a dedicated extended-reality device. As used herein, the term "extended-reality device" refers to a computing device having extended-reality capabilities and/or features. An extended-reality device can refer to a computing device that can display an extended-reality graphical user interface. An extended-reality device can further display one or more visual elements within the extended-reality graphical user interface and receive user input that targets those visual elements. For example, an extended-reality device can include, but is not limited to, a virtual-reality device, an augmented-reality device, or a mixed-reality device. In particular, an extended-reality device can include any device capable of presenting a full or partial extended-reality environment. Nonlimiting examples of extended-reality devices can be found throughout this application.

As described previously, a headset includes a display structure that is placed over eyes of a user to display content to the user. The display structure can include one or more µ-OLED display panels that are housed within one or more apertures in the display structure.

In the instant application, the µ-OLED display panel is electrically coupled to an electronic component by an electrical connector, and the µ-OLED display panel is thermally decoupled from the electronic component. The TMS described herein includes an open-thermal structure between the µ-OLED display panel and the electronic component. The TMS described herein thermally decoupling the µ-OLED display panel from the electronic component reduces heat from the electronic component at the µ-OLED display panel to avoid heat generated by the electronic component damaging the µ-OLED display panel. In some examples, the headset can include a thermal frame disposed within the housing. The thermal frame can be coupled to the housing of the headset. The thermal frame can be in direct or indirect thermal contact with one or more components of the headset. The thermal frame is configured to receive thermal energy from the one or more components of the headset, to distribute the thermal energy uniformly throughout the device, and to transfer thermal energy toward an environment located outside of the housing. In some examples, the thermal frame can include and/or be configured to act as a heat sink for the headset. As such, the thermal frame of the headset can disperse thermal energy to an environment surrounding the headset.

In some examples, the electrical connector can include a flexible circuit. The flexible circuit can include a printed board circuit. The electronic component can be disposed on or coupled to the flexible circuit. In some examples, one or more electronic components can be disposed on or coupled to the flexible circuit. The electronic component can include one or more of memory, circuitry, or a processor. In at least one example, the electronic component can include an integrated circuit. The integrated circuit can include a display driver integrated circuit (DDIC).

Heat generated by the µ-OLED display panel can be mitigated by a passive cooling approach and/or an active cooling approach. In some examples, passive cooling can be implemented by a system fan and a U-shaped heat sink. The system fan can provide cooling air to the TMS. This approach can employ a U-shaped heat sink that takes in cooling air and cools the µ-OLED display panel. In some examples, active cooling can be implemented by an integrated fan. The integrated fan can provide cooling air directly to the µ-OLED display panel.

A TMS as described herein can be configured to limit heat from the electronic component from reaching the µ-OLED display panel. In examples, the TMS can be configured with a system fan arranged to draw thermal energy away from the µ-OLED display panel. The system fan provides the extended-reality headset with air flow that can dissipate the heat generated by the µ-OLED display panel. The system fan of the headset can be configured to pull air from a first side (e.g., a side of the headset that contacts the user) of the headset, direct air flow over the thermal frame, and push air out of vents that are disposed in the housing of the headset (e.g., around a periphery of the headset). As such, the system fan can reduce a temperature of the thermal frame as air is directed to flow over the thermal frame within the headset and is forced out of the housing of the headset, thereby dissipating thermal energy to the environment located outside of the housing of the headset. In some examples, the thermal frame can include etching and/or ribs that are configured to reduce and/or eliminate turbulent air flow within the housing and/or to control or direct airflow within the housing. In some examples, a heat sink with a heat pipe can be disposed on the electronic component to dissipate heat away from the µ-OLED display panel.

In some examples, the TMS can include thermal architecture formed as a U-shaped heat sink that surrounds the open-thermal structure. As described herein, the U-shaped heat sink can include a bottom plate that contacts the µ-OLED display panel, a top plate that contacts the electronic component, and the electrical connector that can electrically couple the µ-OLED display panel to the electronic component. The bottom plate and the top plate can include a thermally conductive material. In some examples, the bottom plate and/or the top plate can be made of one or more materials including aluminum, magnesium, titanium, conductive ceramics, a conductive polymer, etc. The bottom plate can include an extended surface configured to cover the µ-OLED display panel and configured to conduct heat away from the µ-OLED display panel. The extended surface can be configured to cover all or just a portion of a surface of the µ-OLED display panel. In some examples, the extended surface can cover a majority (e.g., at least about 51%) of the µ-OLED display panel. The extended surface allows for the use of low air velocity provided by the system fan to cool the µ-OLED display panel. In some examples, a surface of the top plate can include a plurality of fins. One or more of the plurality of fins can be configured in an angle approximately aligned with a direction of air flow generated by the system fan. Furthermore, a fin can be approximately aligned when the fin is angled within ±10° of the direction of the air flow.

In some examples, the top plate includes a void configured to interrupt the conductive path of the electronic component mounted thereon. One or more other heat mitigating components can be included in the U-shaped heat sink to further help dissipate heat to an exterior of the device such as a vapor chamber, one or more heat pipes, graphite sheets, etc.

In at least one example, the U-shaped heat sink can include a thermal pass configured to conduct the flow of heat from the bottom plate to the top plate. The thermal pass can be made from a conductive material. In at least one example, the conductive material can include graphite-wrapped foam. The thermal pass can be configured to provide additional structural support to the U-shaped heat sink. A surface of the top plate and/or the electrical connector of the U-shaped heat sink can be affixed to a graphite sheet. The graphite sheet can have high thermal conductivity and can be configured to dissipate heat from structures surrounding the graphite sheet. A spacer, e.g., made of a ceramic material, a plastic material, etc., can be disposed between the top plate and the bottom plate. The spacer can adjust the air flow within the U-shaped heat sink and can substantially inhibit air exhausted by the U-shaped heat sink from re-entering the U-shaped heat sink.

In at least one example, the TMS can include an integrated fan configured to actively cool the µ-OLED display panel. In some examples, the integrated fan can be sandwiched between the µ-OLED display panel and the electronic component. The µ-OLED display panel is electrically coupled to the electronic component by the electrical connector. The electrical connection can be arranged adjacent the integrated fan. In some examples, a plurality of electrical connectors can be arranged adjacent the integrated fan. The plurality of electrical connectors electrically can couple a plurality of electronic components to the μ-OLED display panel. A graphite sheet can be disposed on the electronic component. The graphite sheet can be configured to extend a cooling surface of the electrical connector and can provide the electrical connector with uniform temperature distribution. The integrated fan can focus high speed air locally toward the μ-OLED display panel and can provide more control when mitigating heat generated by the μ-OLED display panel. Additionally, the integrated fan can be compact, can have low weight, and can control the temperature with the fan's speed.

In at least one example, the integrated fan can include at least one blower. In at least one example, the integrated fan can include at least two blowers. The blower(s) can include at least one of a piezo fan, a multi-fan, or a miniature cross flow fan. The integrated fan can include one or more fins disposed between the μ-OLED display panel and the electronic component. The one or more fins can form heat sink channels sandwiched between the μ-OLED display panel and the electronic component. Heat sink channels can increase air velocity and provide increased surface area. The integrated fan can be configured to pull air through the heat sink channels and to push exhausted air up towards the electronic component. The integrated fan can include a spacer, e.g., a plastic spacer, a ceramic spacer, etc., that is sandwiched between the μ-OLED display panel and the electronic component. The spacer can be configured to substantially inhibit exhausted air from re-entering the integrated fan.

In at least one example, the TMS can include an air duct disposed on the μ-OLED display panel. The air duct functions to cool the display panel when air flows through the air duct. In some examples, the electrical connector can include a flexible circuit including a printed circuit board (PCB). The flexible PCB can thermally decouple the electronic component from the μ-OLED display panel while maintaining the electrical connection. In some examples, the flexible PCB can wrap around the air duct such that the air duct is sandwiched between the electronic component and μ-OLED display panel. In some examples the electrical connector can include a rigid PCB. In such cases, the electronic component and the μ-OLED display panel can be formed on the same plane and disposed on the same side of the air duct.

In at least one example, the air duct can include a top duct plate and a bottom duct plate that opposes the top duct plate. The top duct plate and the bottom duct plate can be coupled by a first side duct plate and an opposing second side duct plate. In some examples, the top duct plate and the bottom duct plate can be made of a thermally conductive material, such as a metal material, graphite, and a thermally conductive plastic material. In some examples, the top duct plate and the bottom duct plate can be made from the same material. In some instances, the top duct plate and the bottom duct plate can be made from different materials. In some examples, the first side duct plate and the second side duct plate can be made of a plastic material, such as a lightweight plastic material. In some examples, the first side duct plate and the second side duct plate can be made from the same material. In some instances, the first side duct plate and the second side duct plate can be made from different materials.

In at least one example, the air duct can include a thermal pass configured to conduct the flow of heat from the bottom plate to the top plate. The thermal pass can be made from a conductive material. In at least one example, the conductive material can include graphite-wrapped foam. The thermal pass can be configured to provide additional structural support to the air duct. In some examples, the air duct can include a fan, such as a crossflow fan, that circulates air through the air duct and, in turn, cools the μ-OLED display panel. A surface of the μ-OLED display panel can be affixed to a graphite sheet. The graphite sheet can have high thermal conductivity and can be configured to dissipate heat away from the display panel.

In at least one example, the device can comprise a micro-organic light emitting diode (μ-OLED) display panel, an electronic component, an electrical connector electrically coupling the electronic component to the μ-OLED display panel, and a standoff disposed between and physically coupling the electronic component to the μ-OLED display panel with a gap therebetween. The gap can be configured to thermally decouple the electronic component from the μ-OLED display panel.

In some examples, the standoff can include a U-shaped heat sink that includes a bottom plate that is in contact with the μ-OLED display panel, and a top plate that is contact with the electronic component. The electrical connector can couple the bottom plat to the top plate and form a U-shape.

The electronic component can include memory, circuitry, a processor, and/or an integrated circuit (IC). In at least on example, the IC can include a display driver integrated circuit (DDIC).

The electrical connector can include a flexible circuit. In at least one example, the flexible circuit can include a printed circuit board (PCB).

In some examples, a system fan can be spaced a distance from the standoff. The system fan is configured to circulate cooling air between and around the gap between the electronic component to the μ-OLED display panel.

In some examples, a surface of the top plate can include a plurality of fins that are configured in an angle approximately aligned with a direction of air flow generated by the system fan.

In some examples, the U-shaped heat sink can include a thermal pass disposed between the bottom plate and the top plate. The thermal pass can be configured to conduct heat between the bottom plate and the top plate. In some examples, the thermal pass can be made of graphite wrapped foam.

In some examples, a graphite sheet can be disposed on the bottom plate and/or the top plate.

In some examples, the U-shaped heat sink can include a spacer that is disposed between the bottom plate and the top plate. The spacer can be configured to substantially inhibit air exhausted by the U-shaped heat sink from re-entering the U-shaped heat sink.

In some examples, a heat sink and a heat pipe can be coupled to the electronic component such that heat generated by the electronic component is dissipated away from the μ-OLED display panel.

In some examples, a graphite sheet can be disposed on the μ-OLED display panel. The graphite sheet can be configured to conduct heat generated by the μ-OLED display panel away from the μ-OLED display panel.

In at least on example, the device can include a head-mounted device that includes a display housing. The electronic component and the μ-OLED display panel can be disposed within the display housing of the head-mounted device.

In at least one example, the U-shaped heat sink can include an air duct that is configured to cool the μ-OLED display panel when air flows through the air duct. In some cases, the air duct is disposed between the bottom plate and the top plate of the U-shaped heat sink. The air duct can include a top plate that is made of a first thermally conductive material, a bottom plate that is made of a second thermally conductive material. The top plate can be disposed opposing the bottom plate. The air duct can further include a first side plate that connects the top plate to the bottom plate, and a second side plate the connects the top plate to the bottom plate. The first side plate can be disposed opposing the second side plate. In some cases, the first side plate and the second side plate are made of a plastic material, such as a lightweight plastic material.

In at least one example, the device can be a head-mounted device that includes a display housing and a display assembly disposed in the housing. The display assembly can include a first µ-OLED display panel, a first electronic component, a first electrical connector that electrically couples the first electronic component to the first µ-OLED display panel, a second µ-OLED display panel, a second electronic component, a second electrical connector that electrically couples the second electronic component to the second µ-OLED display panel, a first U-shaped heat sink that is disposed in the a first space between the first µ-OLED display panel and the first electronic component, a second U-shaped heat sink that is disposed in a second space between the second µ-OLED display panel and the second electronic component, and one or more fans that is disposed in the housing and is configured to circulate air through the first space between the first µ-OLED display panel and through the second space between the second µ-OLED display panel and the second electronic component. In some examples, the first U-shaped heat sink can include a first bottom plate that is contact with the first µ-OLED display panel, and a first top plate in contact with the first electronic component where the first electrical connector can couple the first bottom plate to the first top plate. The second U-shaped heat sink can include a second bottom plate that is in contact with the second µ-OLED display panel, and a second top plate in contact with the second electronic component where the second electrical connector can couple the second bottom plate to the second top plate.

In at least one example, the display assembly can include a system fan that is configured to pull air through the first U-shaped heat sink and the second U-shaped heat sink.

In at least one example, the display assembly can include a first air intake channel, a second air intake channel, a first exhaust channel, and a second exhaust channel. The display assembly can be configured such that the system fan pulls air through the first air intake channel before going through the first U-shaped heat sink and then pushes air out through the first exhaust channel, and the system fan pulls air through the second air intake channel before going through the second U-shaped heat sink and then pushes the air out through the second exhaust channel.

In at least one example, the head-mounted device can include a first system fan and second system fan. The first system fan can be configured to pull air through the first U-shaped heat sink, and the second system fan can be configured to pull air through the second U-shaped heat sink.

In at least one example, the head-mounted deice can include a first air intake channel, a second air intake channel, a first exhaust channel, and a second exhaust channel. The first system fan can be configured to pull air through the first air intake channel before going through the first U-shaped heat sink and then push the air out through the first exhaust channel, and the second system fan can be configured to pull air through the second air intake channel before going through the second U-shaped heat sink and then push the air out through the second exhaust channel.

In at least one example, the device can include a micro-organic light emitting diode (µ-OLED) display panel, an electronic component, an electrical connector that electrically couples the electronic component to the µ-OLED display panel, and a fan that is integrated with the µ-OLED display panel. In some cases, the fan can include a fan housing, and at least one blower that is disposed between the fan housing and the µ-OLED display panel.

The electronic component can include memory, circuitry, a processor, and/or an integrated circuit (IC). In at least on example, the IC can include a display driver integrated circuit (DDIC).

In at least one example, the electrical connector can include a rigid printed circuit board (PCB) that thermally couples the electronic component and the µ-OLED display panel where the electronic component and the µ-OLED display panel can be disposed on the same plane.

In at least one example, the device can include a standoff that is disposed between and physically couples the electronic component to the µ-OLED display panel with a gap therebetween. The gap can thermally decouple the electronic component from the µ-OLED display panel. The electrical connector can include a flexible PCB where the electronic component can be disposed on the fan housing. The fan that is integrated with the µ-OLED display panel can be disposed between the electronic component and the µ-OLED display panel.

In some examples, the electronic component can be a first electronic component, and the electrical connector can be a first electrical connector. The device can include a second electronic component and a second electrical connector that electrically couples the second electronic component to the µ-OLED display panel. The second electronic component can be made of a flexible PCB that is disposed on the fan housing and arranged adjacent to the first electronic component.

A graphite sheet can be disposed on and thermally coupled to the electronic component.

In at least one example, the at least one blower can include a cross-flow fan. In some examples, the fan integrated with the µ-OLED display panel can include at least two blowers. In some examples, the fan can include a plurality of fins that are disposed between the fan housing and the µ-OLED display panel where the plurality fins form heat sink channels sandwiched between the fan housing and the µ-OLED display panel. In some examples, the fan be configured to pull air radially inward and to push exhausted air axially towards the fan housing.

In at least one example, the device can include a head-mounted device that includes a display housing where the electronic component and the µ-OLED display panel can be disposed within the display housing.

In some examples, a graphite sheet can be disposed on the µ-OLED display panel and can be configured to conduct heat generated by the µ-OLED display panel away from the µ-OLED display panel.

In at least one example, the device can be a head-mounted device that includes a display housing, and a display assembly that is disposed in the display housing. The display housing can include a first µ-OLED display panel, a first electronic component, a first electrical connector that electrically couples the electronic component to the first µ-OLED display panel, a first fan integrated with the first µ-OLED display panel, a second µ-OLED display panel, a second electronic component, a second electrical connector that couples the second electronic component to the second µ-OLED display panel, and a second fan that is integrated with the second µ-OLED display panel. The first fan can include a first fan housing and at least one first blower that is disposed between the first fan housing and the first µ-OLED display panel. The second fan include a second fan housing, and at least one second blower that is disposed between the second fan housing and the second µ-OLED display panel.

In at least one example, the at least one first blower can be configured to push and/or pull air through the first fan housing and the at least one second blower can be configured to push and/or pull air through the second fan housing.

In at least one example, the head-mounted device can include a first air intake channel, a second air intake channel, a first exhaust channel, and a second exhaust channel. The at least one first blower can be configured to pull air through the first intake channel before going through the first fan housing and to then push air out through the first exhaust channel. The at least one second blower can be configured to pull air through the second intake channel before going through the second fan housing and to then push air out through the second exhaust channel.

In at least one example, the device can include a micro-organic light emitting diode (µ-OLED) display panel, an electronic component, an electrical connector that electrically couples the electronic component to the µ-OLED display panel, and an air duct that is physically coupled to the electronic component and the µ-OLED display panel. The air duct can be configured to cool the µ-OLED display panel when air flower through the air duct.

The electronic component can include memory, circuitry, a processor, and/or an integrated circuit (IC). In at least on example, the IC can include a display driver integrated circuit (DDIC).

In some examples, the electrical connector can include a flexible circuit that includes a printed circuit board (PCB) and can be configured to thermally decouple the electronic component from the µ-OLED display panel.

In at least one example, the device can include a standoff that is disposed between and physically couples the electronic component to the µ-OLED display panel. The standoff can include a U-shaped heat sink that includes a bottom plate that is in contact with the µ-OLED display panel, and a top plate that is contact with the electronic component where the electrical connector couples the bottom plate to the top plate. The air duct can be disposed between the bottom plate and the top plate.

In at least one example, the electrical connector can include a rigid PCB that thermally couples the electronic component and the µ-OLED display panel where the electronic component and the µ-OLED display can be disposed on the same plane.

In at least one example, the air duct can include a top plate made of a first thermally conductive material, a bottom plate made of a second thermally conductive material, a first side plate that connects the top plate to the bottom plate, and a second side plate that connect the top plate to the bottom plate. The top plate can be disposed opposite the top plate, and the first side plate can be disposed opposite the second side plate. In some examples, the first side plate and the second plate can be made of a plastic material, such as a lightweight plastic material.

In various examples, the air duct can include a thermal pass that is disposed between the bottom plate and the top plate and is configured to conduct heat between the bottom plate and the top plate. In some examples, the air duct can include a graphite sheet disposed on the bottom late and/or the top plate that is configured to conduct heat away from the µ-OLED display panel.

In at least one example, the device can include a system fan that is spaced a distance from the air duct and is configured to pull air through the air duct. In some examples, the air duct can include a crossflow fan that is configured to circulate air through the air duct.

In some examples, a graphite sheet can be disposed on the µ-OLED display panel and can be configured to conduct heat generated by the µ-OLED display panel away from the µ-OLED display panel.

In at least one example, the device can include a head-mounted device that includes a display housing where the electronic component and the µ-OLED display panel can be disposed within the display housing.

In at least one example, the head-mounted device can include a display housing and a display assembly disposed in the housing. The display assembly can include a first µ-OLED display panel, a first electronic component, a first electrical connector that electrically couples the first electronic component to the first µ-OLED display panel, a first air duct physically coupled to the first electronic component and the first µ-OLED display panel configured to cool the first µ-OLED display panel when air flows through the first air duct, a second µ-OLED display panel, a second electronic component, a second electrical connector that electrically couples the second electronic component to the second µ-OLED display panel, and a second air duct that is physically coupled to second electronic component and the second µ-OLED display panel configured to cool the second µ-OLED display panel when air flows through second air duct.

In at least one example, the display assembly can include a first system fan that is configured to pull air through the first air duct, and a second system fan that is configured to pull air through the second air duct. In some examples, the head-mounted device can include a first air intake channel, a second air intake channel, a first exhaust channel, and a second exhaust channel. The first system fan can be configured to pull air through the first intake channel before going through the first air duct and then to push the air out through the first exhaust channel. The second system fan can be configured to pull air through the second air intake channel before going through the second air duct and then to push the air out through the second exhaust channel.

In at least one example, the first air duct can include a first cross-flow fan that is configured to circulate air through the first air duct, and the second air duct can include a second cross-flow fan that is configured to circulate air through the second air duct.

These and other aspects are described further below with reference to the accompanying drawings and appendices. The drawings merely illustrate examples and should not be construed to limit the scope of the claims. For example, while examples are illustrated in the context of a head-mounted electronic device, the techniques may be used in association with any electronic device. Examples of other electronic devices with which all or portions of the TMSs described herein may be used include, without limitation, wearable devices (e.g., glasses, helmets, visors, headphones, earbuds, watches, and other wrist wearables, etc.), handheld devices (e.g., phones, tablets, portable gaming devices, etc.), laptops, and/or personal computers.

FIG. 1 illustrates a perspective view and a user's point of view of an example electronic headset 100 having a display housing 102 and a TMS 104. In some examples, the TMS 104 including an electronic component (not shown) and a µ-OLED display panel (not shown) can be disposed directly behind a lens structure 106 and/or can be located within an aperture of a display housing 102 of the electronic headset. As mentioned previously, the TMS 104 can be configured to draw thermal energy from the µ-OLED display panels in the display housing 102. Furthermore, various components of the TMS 104 can also provide structural support for the electronic headset and can be configured to protect various components of the electronic headset. The electronic headset can be an extended-reality headset, wherein the user can experience an extended-reality environment that the user can interact with. In some examples, the µ-OLED display panels can be moveable so that the user can adjust the display panels to fit their eyes for interpupillary distance (IPD) of various users. The IPD is the measured distance between the center of the pupils of a user. Adjustability of the IPD facilitates the electronic headset 100 comfortably fitting over the eyes of a greater number of users so that users having different facial bone structures and head shapes and sizes can have an enjoyable experience.

Figure 2:
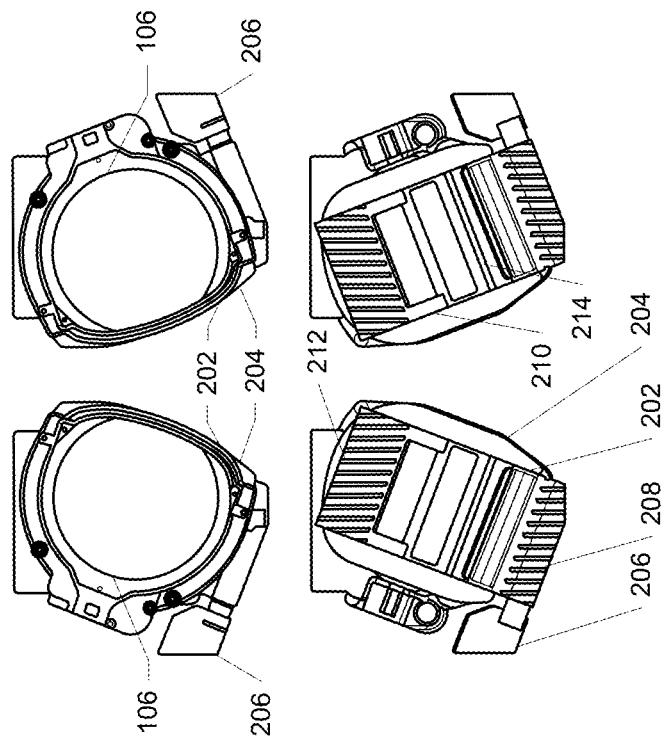
FIG. 2 illustrates a perspective views of a thermal management system in accordance with an example of the present disclosure.
Figure 2:
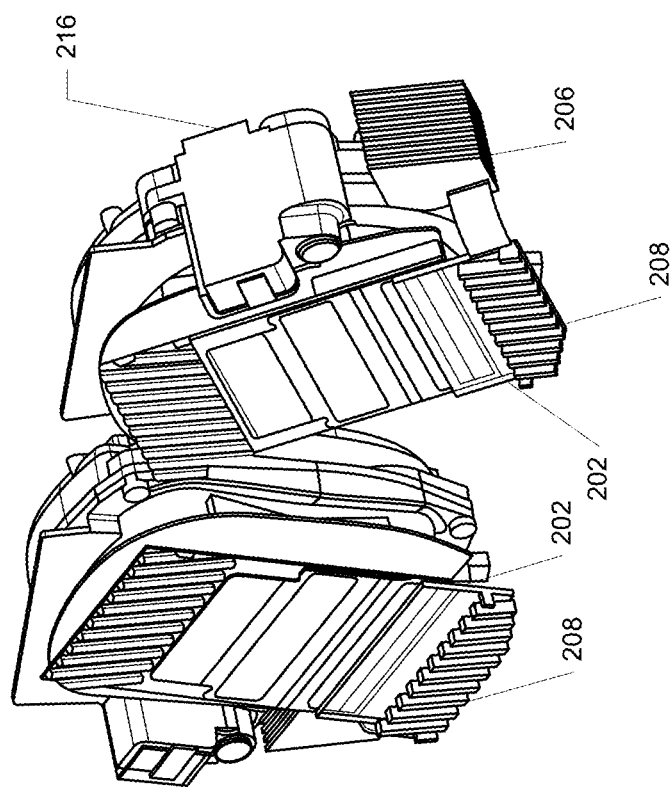

FIG. 2 illustrates perspective views of example components of an example headset TMS (such as TMS 104 as introduced in FIG. 1) omitting the display housing. FIG. 2 illustrates an electronic component 202. In some examples, the electronic component 202 can include a display driver integrated circuit (DDIC) that is electrically coupled to a µ-OLED display panel 204 located behind a lens structure 106. In some examples, a heat sink 206 and a heat pipe 208 can be thermally coupled to the DDIC. The heat sink 206 and heat pipe 208 can mitigate heat generated by the electronic component such that the heat is driven away from the µ-OLED display panel 204. In some examples, the DDIC can be disposed on a top plate 210. The top plate can include fins 212 and a void 214. The fins 212 can be configured in an angle approximately aligned with a direction of air flow generated by a system fan (not shown). The angle of the fins 212 can decrease losses in air flow speeds around the fins 212 and efficiently cools the fins due to the high air flow speeds maintained by the angled fins 212. The void 214 electrically interrupts the DDIC from the surfaces of the top plate 210. In some examples, an adjustable focus mechanism 216 can be included. An adjustable focus mechanism 216 functions to adjust the focal length of the lens structure 106.

Figure 3:
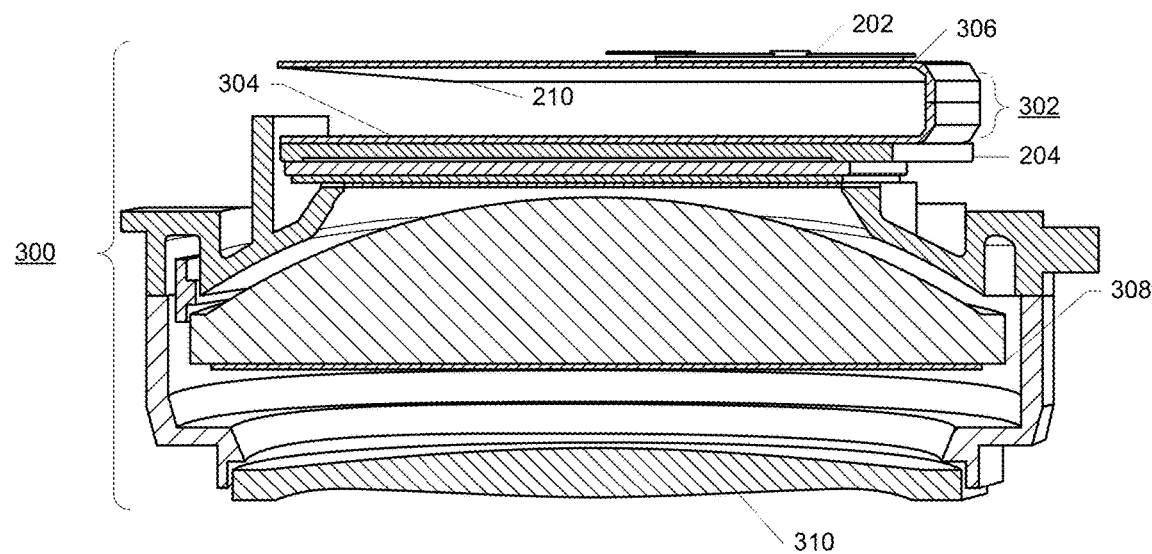
FIG. 3 illustrates a cross-sectional view of a display structure including a thermal management system in accordance with an example of the present disclosure.

FIG. 3 illustrates a cross-sectional view of an example structure 300 including a TMS (such as TMS 104 as introduced in FIG. 1). In at least one example, the TMS can include a U-shaped heat sink 302. The U-shaped heat sink 302 includes a bottom plate 304 that contacts the µ-OLED display panel 204 (as introduced in FIG. 2), a top plate 210 (as introduced in FIG. 2) that contacts the electronic component 202 (as introduced in FIG. 2), and an electrical connector 306 that electrically couples the µ-OLED display panel 204 to the electronic component 202. The electrical connector 306 can be a flexible PCB that folds around the top and bottom plates and forms a U-shaped configuration. The bottom plate 304 and the top plate 210 (as introduced in FIG. 2) can be made from one or more materials including a thermally conductive material, such as aluminum, magnesium, titanium, conductive ceramics, and/or a conductive polymer.

The structure 300 includes a primary lens 308 and a secondary lens 310 that faces the eyes of the user when wearing the electronic headset 100. The lens structure 106 (as introduced in FIG. 1) can include primary lens 308 and secondary lens 310. In the illustrated example, the µ-OLED display panel 204 faces the primary lens 308, which is sandwiched between the µ-OLED display panel 204 and the secondary lens 310.

Micro-OLED display panels will degrade at operating temperatures above 40° C., which is much lower than the operating temperature of the components surrounding the µ-OLED display panels, such as the electronic component 202 that operates at temperatures up to 70° C. In some examples, the U-shaped heat sink 302 distributes heat such that a temperature gradient is formed in the display structure when the electronic headset is operating. For example, the secondary lens 310 can be maintained at less than about 30° C., the primary lens 308 can be maintained at less than about 35° C., the µ-OLED display panel 204 can be maintained at less than about 40° C., and the electronic component 202 can be maintained between about 45° C. and about 70° C.

Figure 4:
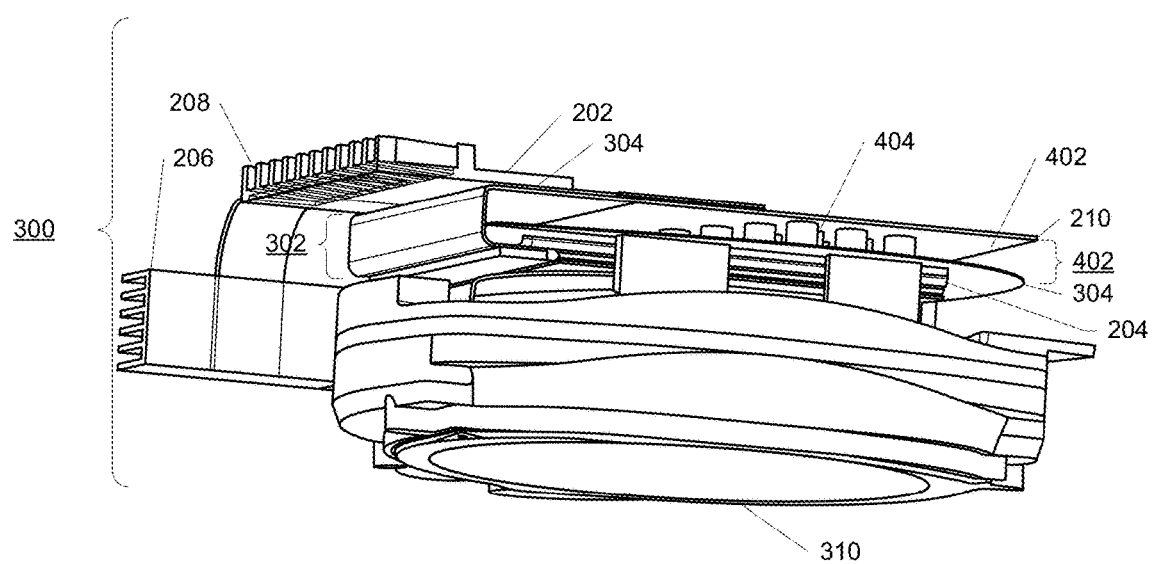
FIG. 4 illustrates a perspective view of a thermal management system in accordance with an example of the present disclosure.

FIG. 4 illustrates a perspective view of an example structure 300 (as introduced in FIG. 3) including a TMS (such as TMS 104 as introduced in FIG. 1). The TMS includes the U-shaped heat sink 302 (as introduced in FIG. 3). In some examples, a heat sink 206 (as introduced in FIG. 2) and heat pipe 208 (as introduced in FIG. 2) can be disposed on the electronic component 202 (as introduced in FIG. 2). The heat sink 206 and heat pipe 208 can be configured to dissipate heat generated by the electronic component 202 away from the µ-OLED display panel 204. In some examples, a thermal pass 402 can be disposed within the U-shaped heat sink 302, and between the top plate 210 and the bottom plate 304 (as introduced in FIG. 3). Heat generated by the µ-OLED display panel 204 that is transmitted to the bottom plate 304 is transmitted to the top plate 210 via the thermal pass 402. In some examples, the thermal pass 402 can include supports 404, which can, in some examples, include conductive fins that are made of graphite wrapped foam.

Figure 5:
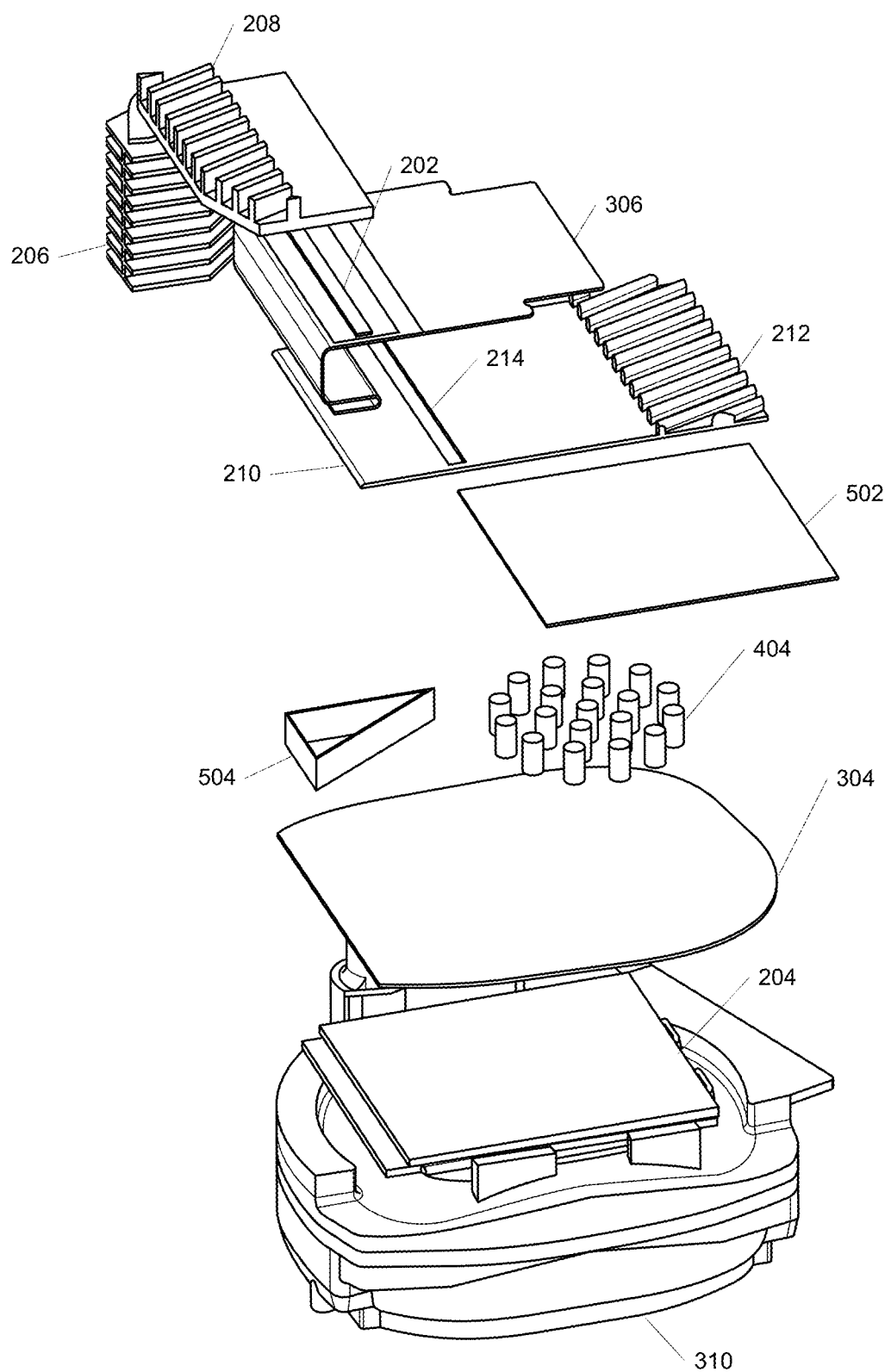
FIG. 5 illustrates an exploded view of a thermal management system in accordance with an example of the present disclosure.

FIG. 5 illustrates an exploded view of an example TMS (such as TMS 104 as introduced in FIG. 1). In some examples, the TMS can include a heat sink 206 (as introduced in FIG. 2) and heat pipe 208 (as introduced in FIG. 2) that is disposed on the electronic component 202 (as introduced in FIG. 2). The heat sink 206 and heat pipe 208 draw the heat generated by the electronic component 202 away from the µ-OLED display panel 204 (as introduced in FIG. 2). The electronic component 202 can be disposed on an electrical connector 306 (as introduced in FIG. 3), such as a flexible circuit. The electrical connector 306 can include a printed circuit board (PCB). The electrical connector 306 can be configured to be disposed on a top plate 210. In some examples, the top plate 210 can be made of one or more thermally conductive materials, such as aluminum, magnesium, titanium, conductive ceramics, a conductive polymer, etc. The top plate 210 can include a cutout portion (or void) 214 that can electrically isolate the electronic component 202 from the top plate 210. In some examples, the top plate 210 can include fins 212 (as introduced in FIG. 2). In various examples, the fins 212 can be configured in an angle approximately aligned with a direction of air flow generated by a system fan (not shown).

In some examples, a graphite sheet 502 can be disposed on a surface of the top plate 210. The graphite sheet 502 has high thermal conductivity and can absorb the heat conducted by the surrounding structures. Bottom plate 304 can be disposed on the µ-OLED display panel 204 and opposes the top plate 210. The bottom plate 304 is made of a thermally conductive material, such as aluminum, magnesium, titanium, conductive ceramics, and/or a conductive polymer. The bottom plate 304 can include an extended surface that covers a surface of the µ-OLED display panel 204. The extended surface can be configured to conduct heat away from the µ-OLED display panel 204. In various examples, the extended surface can cover all or just a portion of the surface of the µ-OLED display panel 204. In some examples, the extended surface can cover a majority (e.g., at least 51%) of the surface of the µ-OLED display panel 204. The electrical connector 306 can couple the top plate 210 with the bottom plate 304 and form a U-shaped heat sink. A thermal pass can be disposed between the top plate 210 and bottom plate 304. In some examples, the thermal pass can include supports 404 made of graphite wrapped foam. The thermal pass with supports 404 can provide structural support to the TMS and can be configured to conduct heat generated by the µ-OLED display panel 204 towards the top plate 210. As shown in the illustrated example, in some examples, a spacer 504 can be disposed between the top plate 210 and the bottom plate 304. The spacer 504 can inhibit or prevent warm air exhausted by the U-shaped heat sink from re-entering the U-shaped heat sink. The µ-OLED display panel 204 can be located between the bottom plate 304 and a structure that includes a lens 310 configured for viewing.

Figure 6:
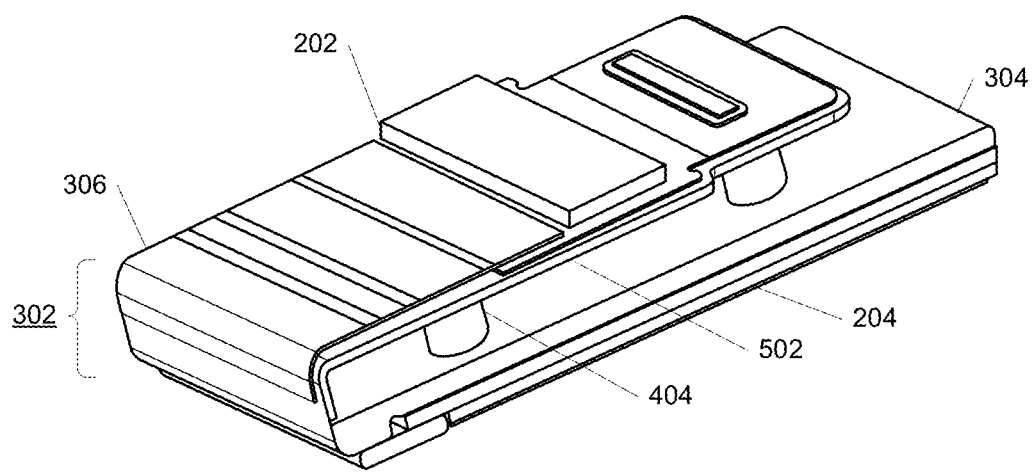
FIG. 6 illustrates a perspective view of a U-shaped heat sink in accordance with an example of the present disclosure.

FIG. 6 illustrates a perspective view of an example TMS (such as TMS 104 as introduced in FIG. 1). The TMS can include a U-shaped heat sink 302 (as introduced in FIG. 3). The U-shaped heat sink includes the top plate 210 (as introduced in FIG. 2), the bottom plate 304 (as introduced in FIG. 3), and an electrical connector 306 (as introduced in FIG. 3) that folds around the top and bottom plates. The electronic component 202 (as introduced in FIG. 2) is mounted on the electrical connector 306 and is electrically coupled to the µ-OLED display panel 204 (as introduced in FIG. 2). In some examples, the electronic component 202 is a DDIC and controls the µ-OLED display panel 204 (as introduced in FIG. 2). A thermal pass is disposed between the top and bottom plates. The thermal pass can be configured to transmit heat from the bottom plate 304 to the top plate 210. Furthermore, in some examples, the thermal pass can include supports 404 (as introduced in FIG. 4) that can provide structural support to the U-shaped heat sink. A graphite sheet 502 (as introduced in FIG. 5) is disposed on the electrical connector 306. Graphite sheets are highly, thermally conductive are configured to absorb heat from the surrounding structures. In some examples, the graphite sheet 502 can be disposed on the electronic component 202 and/or the top plate 210.

Figure 7:
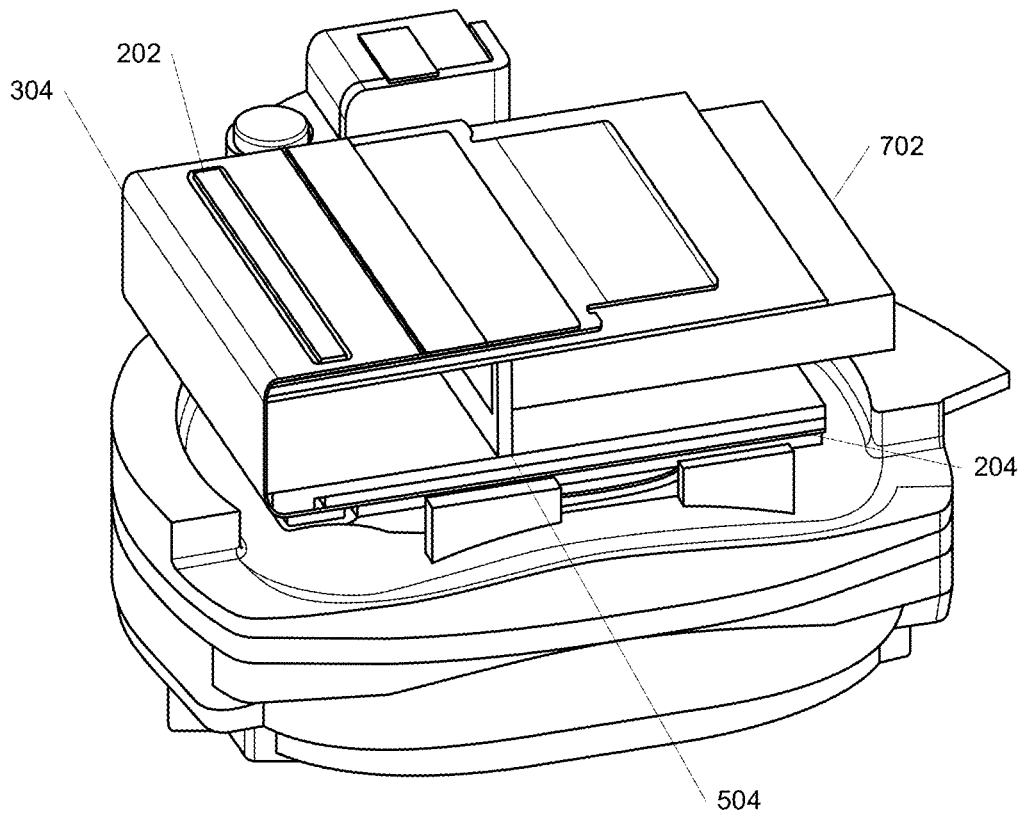
FIG. 7 illustrates a perspective view of a thermal management system in accordance with an example of the present disclosure.

FIG. 7 illustrates a perspective view of an example display structure including a TMS (such as TMS 104 as introduced in FIG. 1). In at least one example, the TMS includes an integrated fan 702 that is sandwiched between the electronic component 202 and the µ-OLED display panel 204. An electrical connector 306 folds around the integrated fan 702 to electrically couple the electronic component to the µ-OLED display panel 204. In some examples, the integrated fan 702 can include or be coupled to a spacer 504 (as introduced in FIG. 5) disposed between the electronic component 202 (as introduced in FIG. 2) and the µ-OLED display panel 204 (as introduced in FIG. 2). The spacer 504 can be configured to prevent air exhausted by the integrated fan 702 from re-entering the integrated fan 702.

The integrated fan 702 includes at least one blower (not shown). Some examples of suitable blowers include a piezo fan, a multi-fan, a mini-crossflow fan, etc. The integrated fan 702 can actively cool the µ-OLED display panel 204 by pulling in air at a high speed and directing the high-speed air over a warmed surface of the µ-OLED display panel 204. The high-speed air is warmed and is exhausted out of the integrated fan 702.

Figure 8:
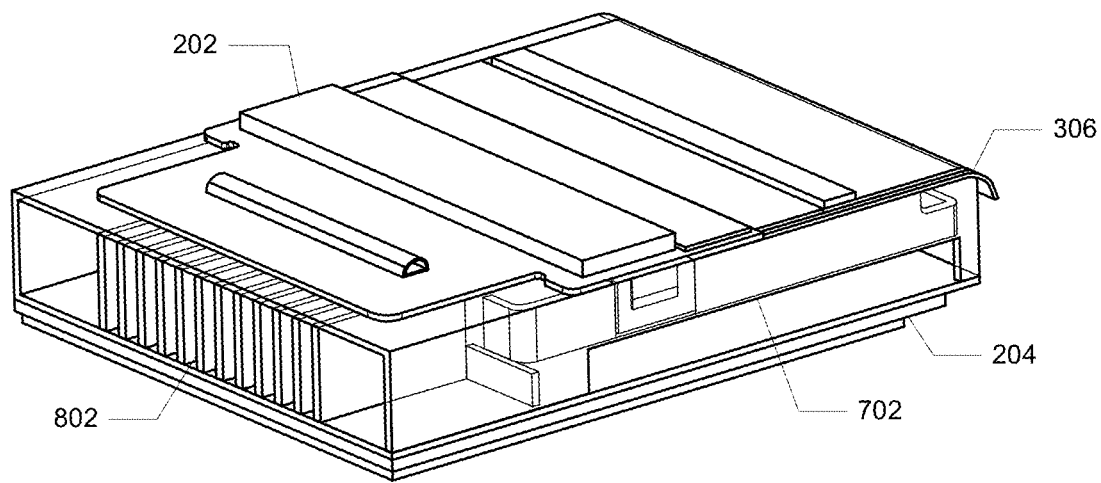
FIG. 8 illustrates a perspective view of an integrated fan in accordance with an example of the present disclosure.

FIG. 8 illustrates a perspective view of an example TMS (such as TMS 104 as introduced in FIG. 1) that includes an integrated fan 702 (as introduced in FIG. 7). The integrated fan 702 is sandwiched between the µ-OLED display panel 204 (as introduced in FIG. 2) and the electronic component 202 (as introduced in FIG. 2). As described in previous examples, the electronic component 202 can be mounted on an electrical connector 306 (as introduced in FIG. 3). Although just partly shown in FIG. 8, the electrical connector 306 can fold around the integrated fan 702 and can electrically couple the electronic component 202 to the µ-OLED display panel 204. The integrated fan 702 includes a blower (not shown) and one or more structures 802, such as spacers or fins adjacent to the blower.

Figure 9:
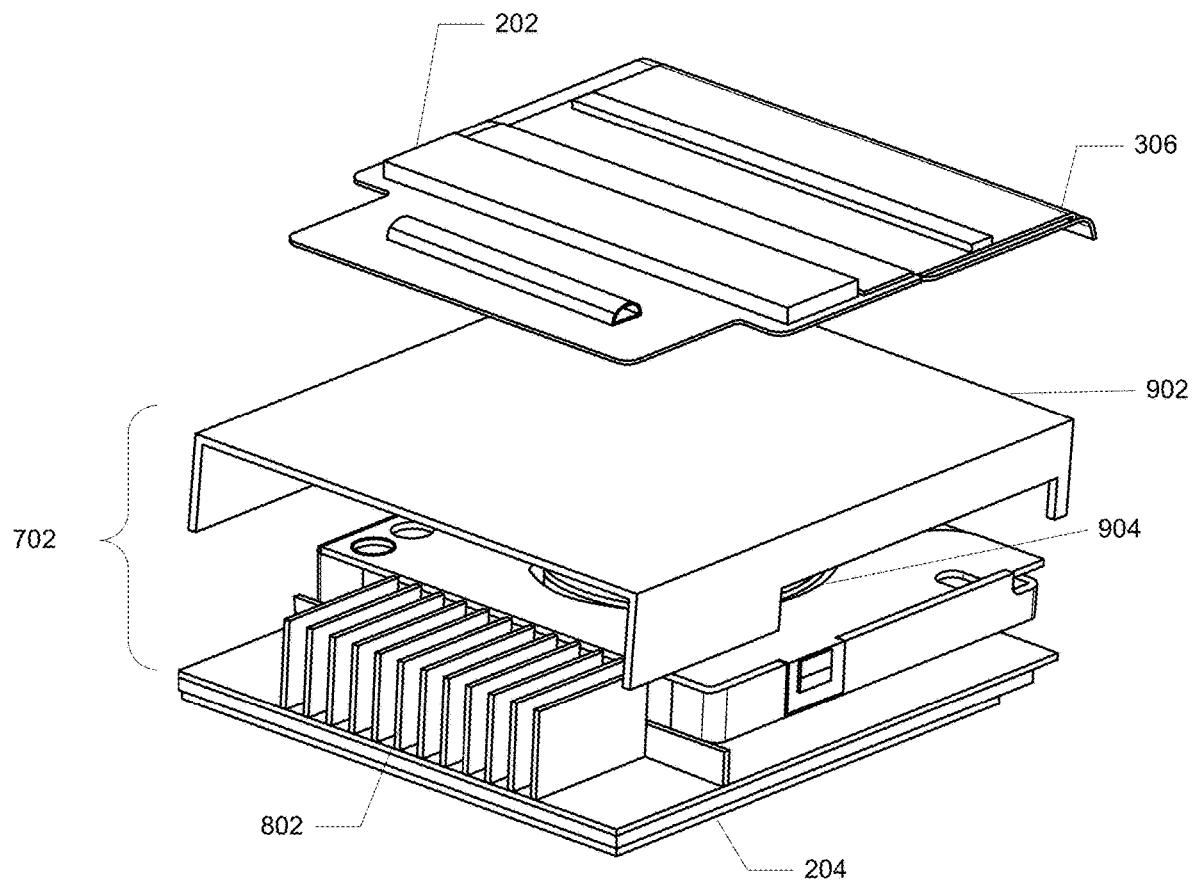
FIG. 9 illustrates an exploded view of an integrated fan in accordance with an example of the present disclosure.

FIG. 9 illustrates an exploded view of the TMS illustrated in FIG. 8. The TMS includes the electronic component 202 (as introduced in FIG. 2) mounted on an electrical connector 306 (as introduced in FIG. 3). The integrated fan 702 (as introduced in FIG. 7) includes a fan housing 902, a blower 904 and a structures 802 (as introduced in FIG. 8) adjacent to the blower 904.

Figure 10:
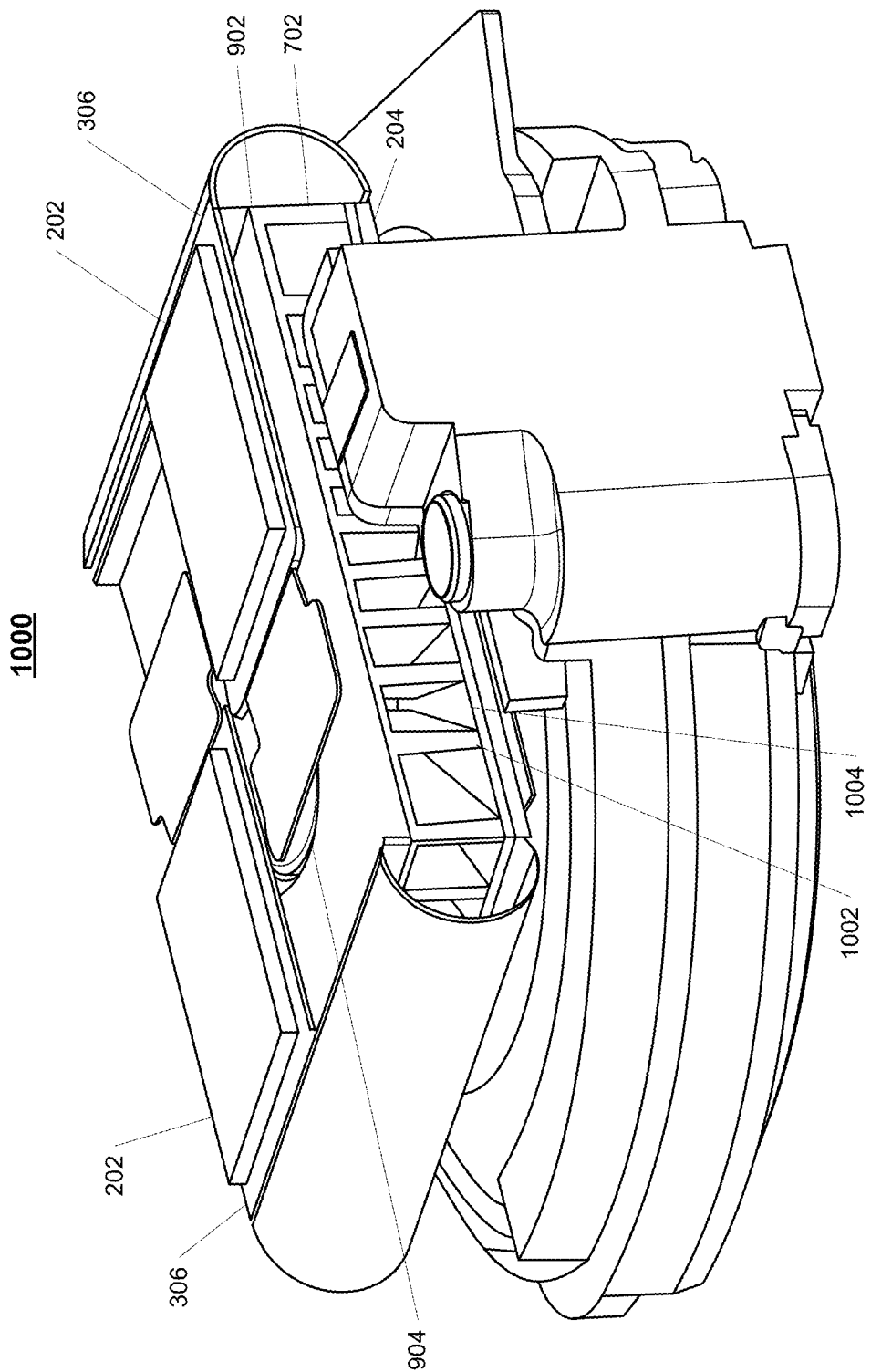
FIG. 10 illustrates a perspective view of a thermal management system in accordance with an example of the present disclosure.

FIG. 10 illustrates a perspective view of a display structure 1000 including an example TMS (such as TMS 104 as introduced in FIG. 1). As shown in FIG. 10, in some examples, the device can include two electronic components 202 (as introduced in FIG. 2) and two electrical connectors 306 (as introduced in FIG. 3). Electronic component(s) 202 can be electrically coupled to a µ-OLED display panel 204 (as introduced in FIG. 2) via electrical connector(s) 306. In the illustrated example, the integrated fan 702 (as introduced in FIG. 7) is between the µ-OLED display panel 204 and the two electronic components 202. The electronic component(s) 202 are mounted on corresponding electrical connector(s) 306. The electrical connectors 306 are folded around an integrated fan 702.

The integrated fan 702 includes a fan housing 902 (as introduced in FIG. 9) and a blower 904 (as introduced in FIG. 9). A plurality of fins 1002 are formed around the blower 904. The plurality of fins 1002 are sandwiched between the electronic component 202 and the µ-OLED display panel 204, and form heat sink channels 1004. During operation, the heat sink channels 1004 increase the air speed and provide increase surface area to exchange heat with the fast-moving air. The integrated fan 702 is configured to pull air through the heat sink channels 1004 and to push exhausted air up towards the electronic component 202.

Figure 11:
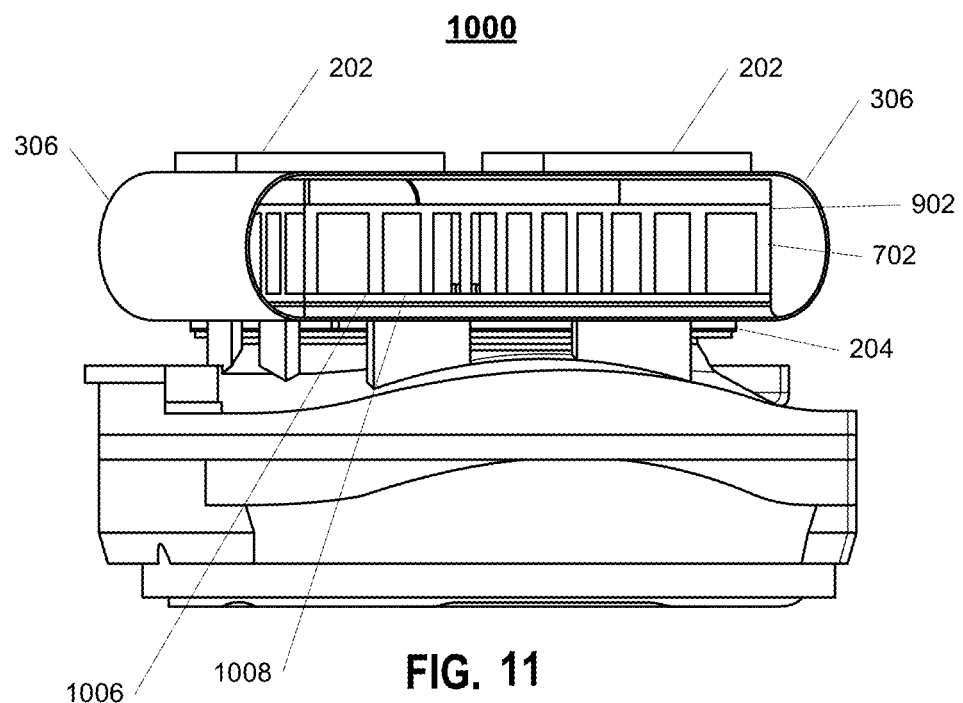
FIG. 11 illustrates a cross-sectional view of a thermal management system in accordance with an example of the present disclosure.

FIG. 11 illustrates a cross-sectional view of the display structure 1000 as shown in FIG. 10. Display structure 1000 includes two electronic components 202 (as introduced in FIG. 2) and two electrical connectors 306 (as introduced in FIG. 3). Electronic component(s) 202 are electrically coupled to a µ-OLED display panel 204 (as introduced in FIG. 2) via electrical connector(s) 306. In the illustrated example, an integrated fan 702 (as introduced in FIG. 7) is between the µ-OLED display panel 204 and the two electronic components 202. The electronic component(s) 202 are mounted on electrical connector(s) 306. The electrical connectors 306 are folded around the integrated fan 702.

The integrated fan 702 includes a fan housing 902 (as introduced in FIG. 9) and a blower (not shown). A plurality of fins 1002 (as introduced in FIG. 10) are formed around the blower. The plurality of fins 1002 are sandwiched between the electronic component 202 and the µ-OLED display panel 204, and form heat sink channels 1004 (as introduced in FIG. 10). During operation, the heat sink channels 1004 can increase the air speed and provide increase surface area to exchange heat with the fast-moving air. The integrated fan 702 is configured to pull air through the heat sink channels 1004 and to push exhausted air up towards the electronic component 202.

Figure 12:
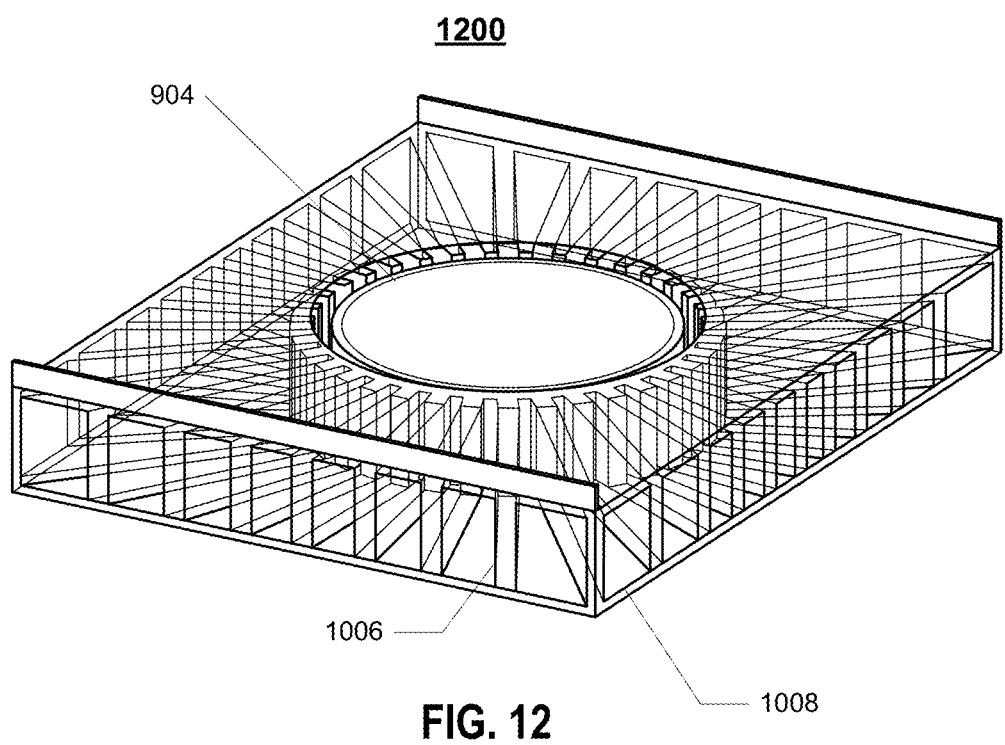
FIG. 12 illustrates a perspective view of the integrated fan in accordance with the example thermal management system illustrated in FIG. 11.

FIG. 12 is a translucent view that illustrates an example integrated fan 1200 suitable for the examples described herein. Integrated fan 1200, in some examples, can represent integrated fan 702 (as introduced in FIG. 7). As illustrated, the integrated fan 1200 includes a blower 904 (as introduced in FIG. 9). The blower 904 can include at least one of a piezo fan, a multi-fan, or a miniature cross flow fan. The integrated fan 1200 includes a plurality of fins 1006 (as introduced in FIG. 10) that form heat sink channels 1008 (as introduced in FIG. 10).

Figure 13:
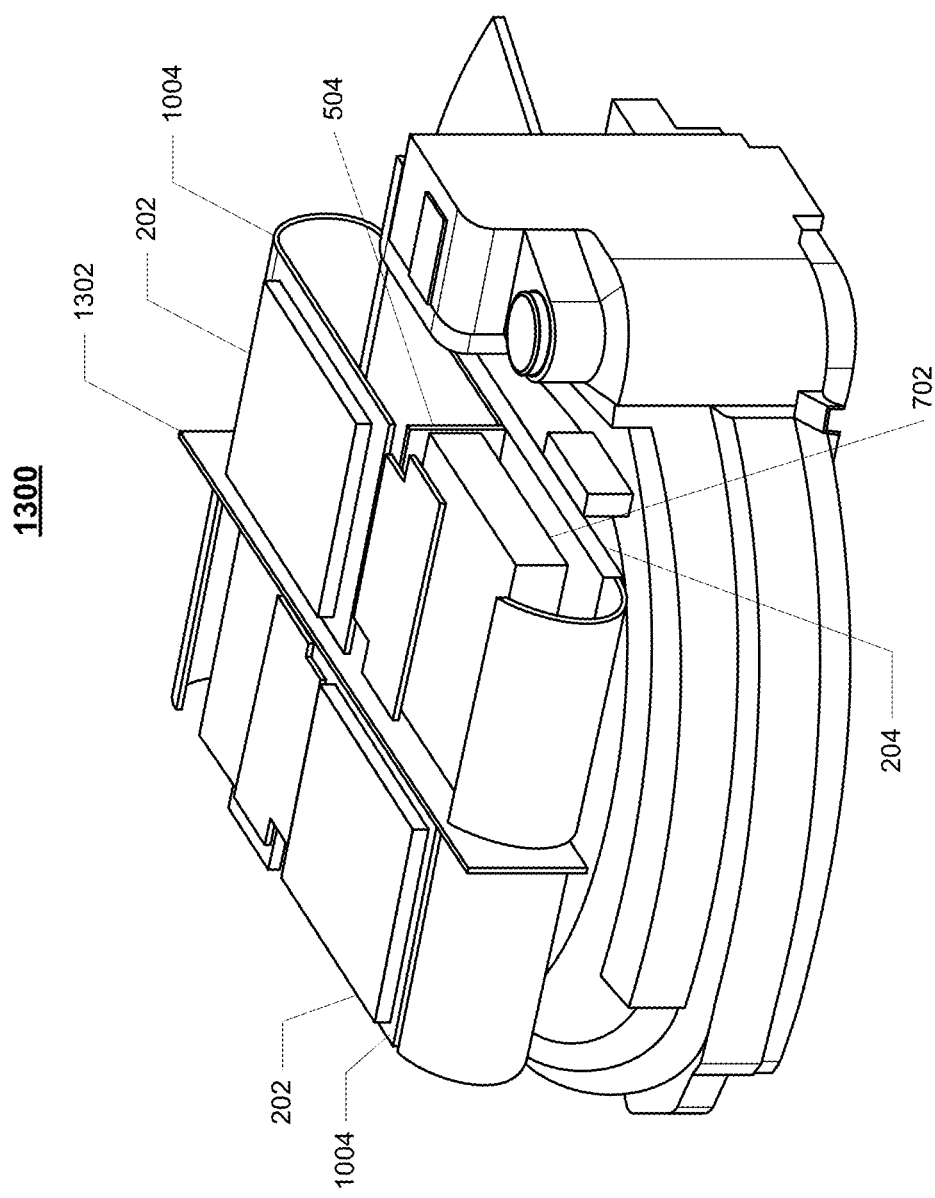
FIG. 13 illustrates a perspective view of a thermal management system in accordance with an example of the present disclosure.

FIG. 13 illustrates a perspective view of a display structure 1300 including an examples TMS (such as TMS 104 as introduced in FIG. 1). In some examples, the structure 1300 can include two electronic components 202 (as introduced in FIG. 2) and two electrical connectors 306 (as introduced in FIG. 3). In the illustrated example, each electronic component 202 is electrically coupled to a μ-OLED display panel 204 (as introduced in FIG. 2) via an electrical connector 306. An integrated fan 702 is disposed between the μ-OLED display panel 204 and each of the two electronic components 202. In some examples, each of the integrated fans 702 can include a blower (not shown); the blowers can be arranged in a cross-flow configuration. The display structure 1300 can include one or more spacer(s) 504 (as introduced in FIG. 5) and/or spacer 1302 that can substantially limit air exhausted by the blowers from re-entering the integrated fan 702.

Figure 14:
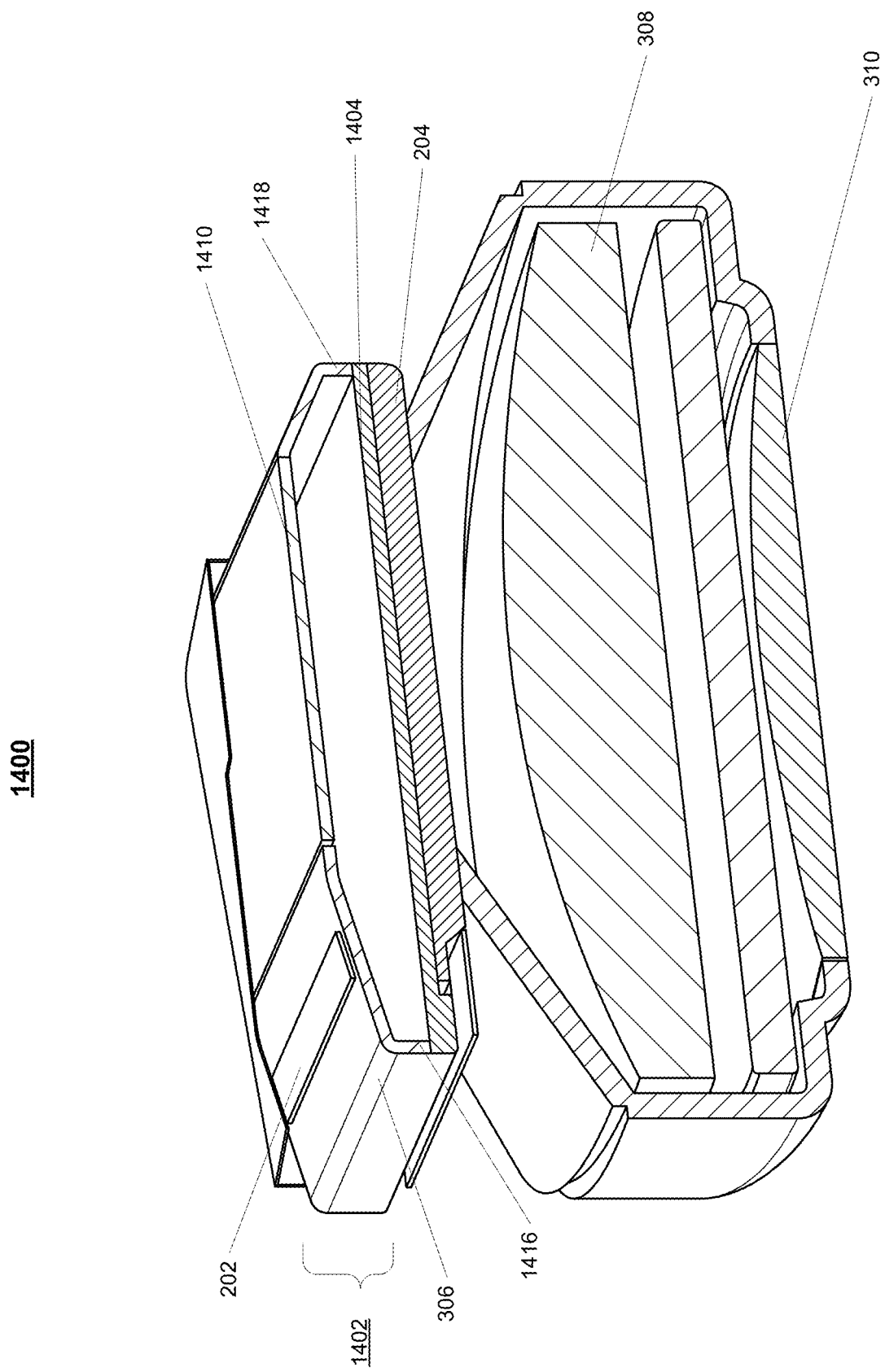
FIG. 14 illustrates a cross-sectional view of a thermal management system in accordance with an example of the present disclosure.

FIG. 14 illustrates a cross-sectional view of an example structure 1400 including a TMS (such as TMS 104 as introduced in FIG. 1). In at least one example, the TMS can include an air duct 1402. In various examples, the air duct 1402 includes a bottom plate 1404 that contacts the μ-OLED display panel 204 (as introduced in FIG. 2), a top plate 1406 that contacts the electronic component 202 (as introduced in FIG. 2), and a first side 1408 and a second side 1410 that couple the top plate 1406 to the bottom plate 1404. In examples, electrical connector 306 electrically couples the μ-OLED display panel 204 to the electronic component 202. The electrical connector 306 (as introduced in FIG. 3) can include a flexible PCB that folds around the top plate 1406 and bottom plate 1404 of the air duct 1402. The bottom plate 1404 and the top plate 1406 can be made from one or more materials including a thermally conductive material, such as metals like aluminum, magnesium, and titanium, conductive ceramics, graphite material, and/or a conductive polymer. The first side 1408 and the second side 1410 can be made from thermally conductive polymers or plastics.

The structure 1400 includes a primary lens 308 and a secondary lens 310 (as introduced in FIG. 3) that will face the eyes of a user when the user is wearing the electronic headset 100. The lens structure 106 (as introduced in FIG. 1) can include primary lens 308 and secondary lens 310. In the illustrated example, the μ-OLED display panel 204 faces the primary lens 308, which is sandwiched between the μ-OLED display panel 204 and the secondary lens 310.

Figure 15:
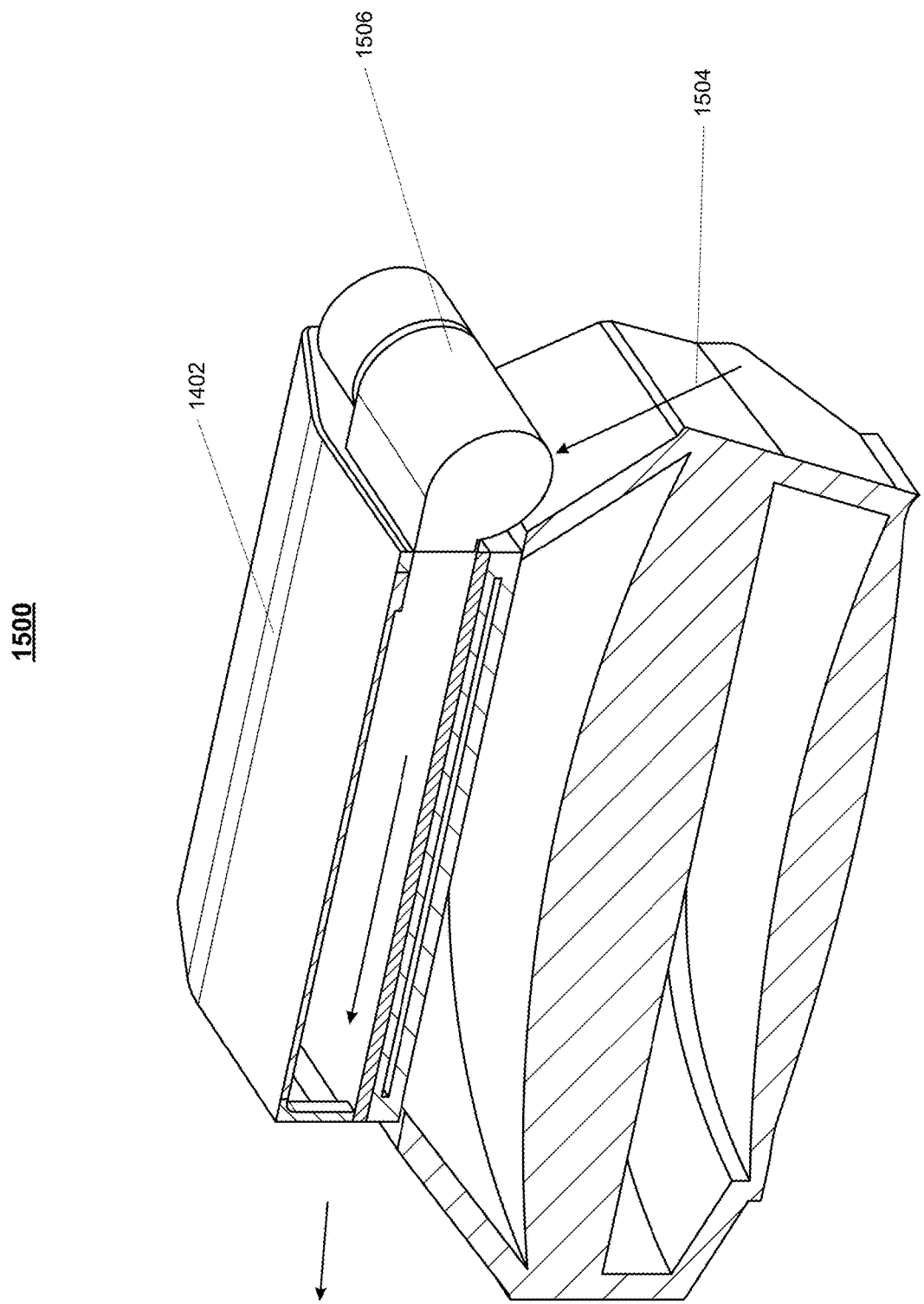
FIG. 15 illustrates a cross-sectional view of a thermal management system in accordance with an example of the present disclosure.

FIG. 15 illustrates a cross-sectional view of an example structure 1500 including a TMS (such as TMS 104 as introduced in FIG. 1). In some examples, an air duct 1402 (as introduced in FIG. 14) can be integrated with a fan that provides the air duct with air flow 1502. In various examples, the fan can be a cross-flow fan 1506, or another type of fan, that can actively cool the μ-OLED display panel in a more precise manner.

Figure 16:
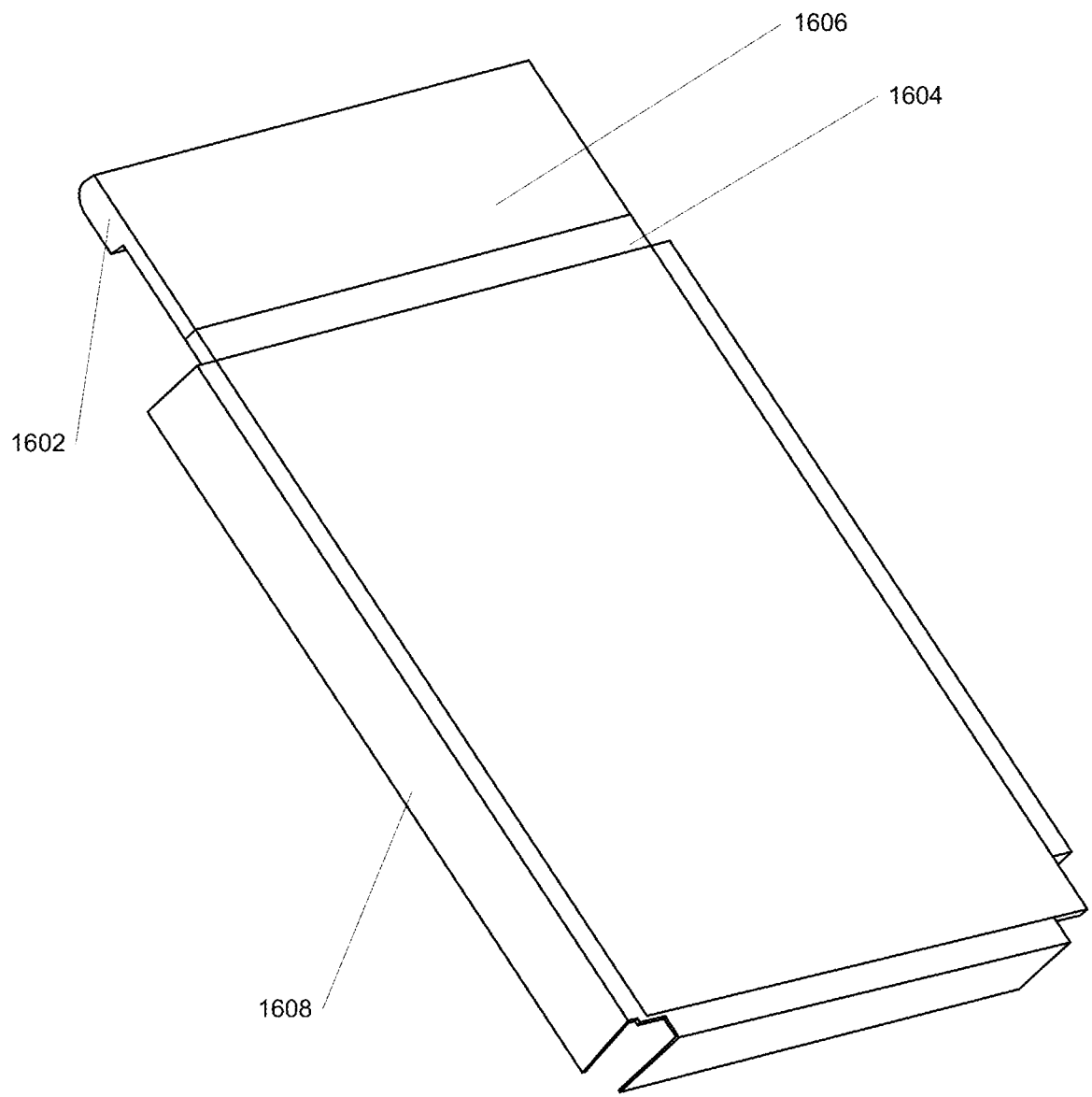
FIG. 16 illustrates a perspective view of thermal management system in accordance with an example of the present disclosure.

FIG. 16 illustrates a perspective view of example components for μ-OLED display module thermal management in various examples as described herein omitting the display housing and TMS. FIG. 16 illustrates an electronic connector 1602 that electrically couples the μ-OLED display panel 1604 with the electronic component 1606. In the illustrated example, the electronic connector 1602 can be a rigid printed circuit board where, unlike previous examples, the electronic connector 1602 and μ-OLED display panel 1604 can be disposed on the same plane. In some examples, a graphite sheet 1608 can be applied to the μ-OLED display panel 1604 to help dissipate heat, such as heat generated by the μ-OLED display panel 1604 away from the μ-OLED display panel 1604.

Figure 17:
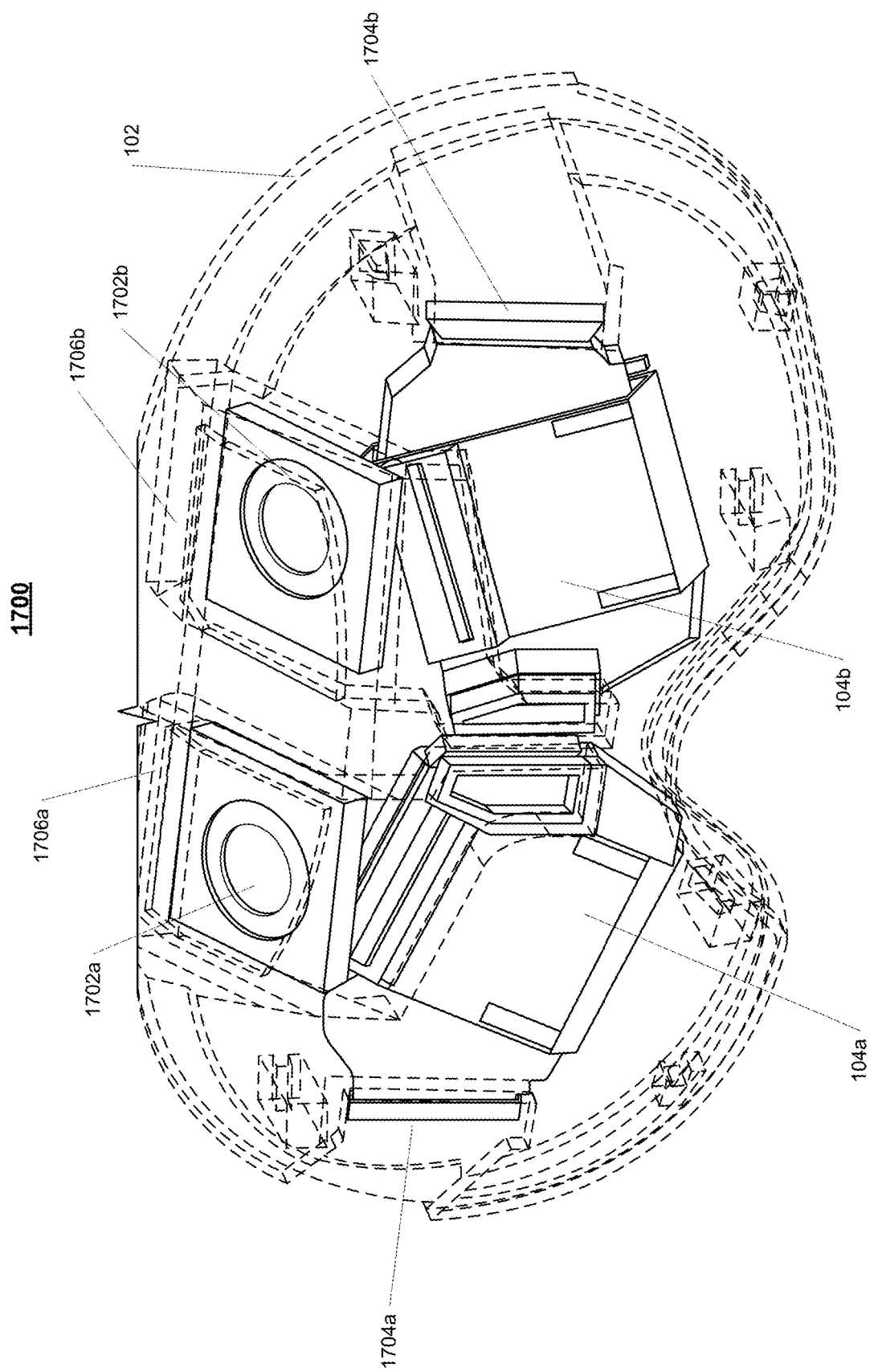
FIG. 17 illustrates a perspective view of an example headset device in accordance with an example of the present disclosure.

FIG. 17 illustrates a perspective view of an example electronic headset 1700 (such as headset 100 as introduced in FIG. 1) having a display housing 102 and a TMS 104 (as introduced in FIG. 1). The headset 1700 can include a first system fan 1702a and a second system fan 1702b that are spaced apart from respective first TMS 104a and second TMS 104b. In some examples, the headset 1700 can include a first intake channel 1704a and a second intake channel 1704b, and a first exhaust channel 1706a and a second exhaust channel 1706b. The first system fan 1702a can be configured to pull atmospheric air through the first intake channel 1704a from which the air enters the first TMS 104a. The air from the first TMS 104a can then be directed to the first system fan 1702a before being pushed out of the device via the first exhaust channel 1706a. The second system fan 1702b can be configured in the same manner as the first system fan 1702a with the respective second intake channel 1704b and second exhaust channel 1706b. In some cases, the air from first TMS 104a and/or second TMS 104b can be used to cool the additional structures and parts included in the headset device 1700 before being pushed out of the headset device 1700 via the respective first exhaust channel 1706a and/or the second exhaust channel 1706b. In at least one example, the intake channels can be made flexible to adjust for interpupillary distance (IPD) of various users. The IPD is the measured distance between the center of the pupils of a user. Adjustability of the IPD facilitates the headset device comfortably fitting over the eyes of a greater number users so that users having different facial bone structures and head shapes and sizes can have an enjoyable experience.

Figure 18:
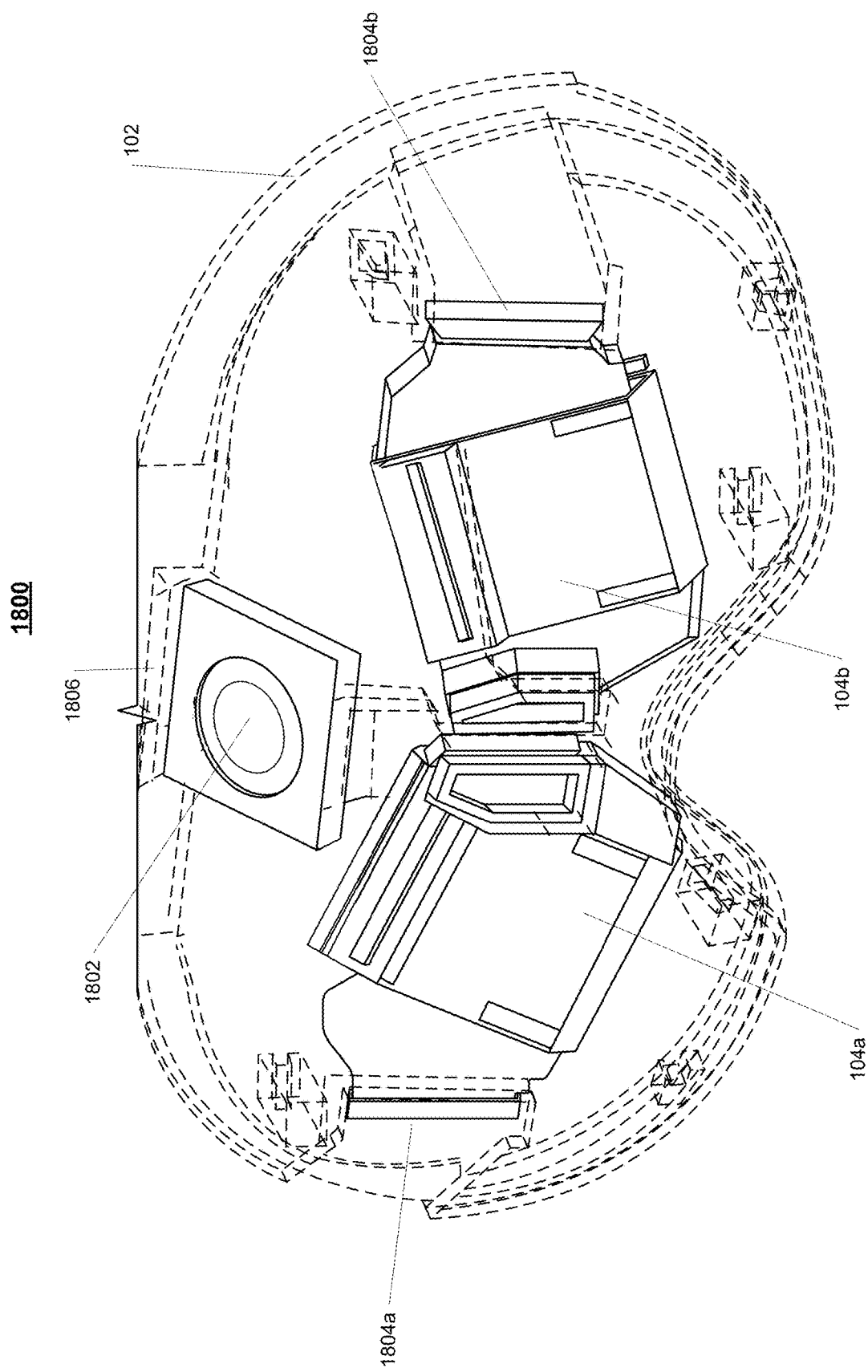
FIG. 18 illustrates a perspective view of an example headset device in accordance with an example of the present disclosure.

FIG. 18 illustrates a perspective view of an example electronic headset 1800 (such as headset 100 as introduced in FIG. 1) having a display housing 102 and a TMS 104 (as introduced in FIG. 1). The headset 1800 includes a single system fan 1802 that is spaced a distance from a first TMS 104a and a second TMS 104b. The headset 1800 can include a first intake channel 1804a and a second intake channel 1804b. The single system fan 1802 can exhaust heated air via a single exhaust channel 1806. In this example, the system fan 1802 can be configured to pull atmospheric air through the first intake channel 1804a and second intake channel 1804b from which the air enters the respective first TMS 104a and second TMS 104b. The air from the first TMS 104a and second TMS 104b can then be directed to the system fan 1802 before being pushed out of the device via the exhaust channel 1806. In some cases, the air from first TMS 104a and/or second TMS 104b can be used to cool additional structures and parts included in the headset device 1800 before being pushed out of the headset device 1800 via the exhaust channel 1806. In at least one example, the intake channels can be made flexible to adjust for interpupillary distance (IPD) of various users. The IPD is the measured distance between the center of the pupils of a user. Adjustability of the IPD can facilitate the headset device comfortably fitting over the eyes of a greater number of users so that users having different facial bone structures and head shapes and sizes can have an enjoyable experience. Although the examples of FIGS. 17 and 18 illustrate electronic headsets with two system fans and a single system fan, respectively, it is contemplated that the electronic headset can include multiple system fans, such as three or more.

CONCLUSION

Although the discussion above describes example techniques and structural features, other architectures may be used to implement the described functionality and are intended to be within the scope of this disclosure. Furthermore, although the subject matter has been described in language specific to structural features and/or methodological acts, it is to be understood that the subject matter defined in the appended claims is not necessarily limited to the specific features or acts described. Rather, the specific features and acts are described as example forms of implementing the claims. For example, the structural features and/or methodological acts may be rearranged and/or combined with each other and/or other structural features and/or methodological acts. In various examples, one or more of the structural features and/or methodological acts may be omitted.

What is claimed is:

1. A device comprising:
a micro-organic light emitting diode (μ-OLED) display panel;
an electronic component;
an electrical connector electrically coupling the electronic component to the μ-OLED display panel; and
a standoff disposed between and physically coupling the electronic component to the μ-OLED display panel with a gap therebetween, the gap thermally decoupling the electronic component from the μ-OLED display panel, wherein the standoff comprises a U-shaped heat sink.

2. The device of claim 1, wherein the U-shaped heat sink comprises:
a bottom plate in contact with the μ-OLED display panel; and
a top plate in contact with the electronic component, the electrical connector coupling the bottom plate to the top plate.

3. The device of claim 2, wherein the U-shaped heat sink further comprises a thermal pass disposed between the bottom plate and the top plate, the thermal pass configured to conduct heat between the bottom plate and the top plate.

4. The device of claim 2, wherein a graphite sheet is disposed on at least one of the bottom plate or the top plate.

5. The device of claim 2, the U-shaped heat sink further comprising a spacer disposed between the bottom plate and the top plate, the spacer configured to substantially inhibit air exhausted by the U-shaped heat sink from re-entering the U-shaped heat sink.

6. The device of claim 2, the U-shaped heat sink further comprising an air duct configured to cool the μ-OLED display panel when air flows through the air duct, wherein the air duct is disposed between the bottom plate and top plate.

7. The device of claim 6, wherein the air duct, comprises:
a top duct plate comprising a first thermally conductive material;
a bottom duct plate comprising a second thermally conductive material, the top duct plate disposed opposite the bottom duct plate;
a first side duct plate that connects the top duct plate to the bottom plate; and
a second side duct plate that connects the top duct plate to the bottom duct plate, the first side duct plate is disposed opposite the second side duct plate, and the first side duct plate and the second side duct plate comprise a plastic material.

8. The device of claim 1, wherein the electronic component comprises at least one of memory, circuitry, a processor, or an integrated circuit (IC).

9. The device of claim 8, wherein the integrated circuit includes a display driver integrated circuit (DDIC).

10. The device of claim 1, wherein the electrical connector includes a flexible circuit.

11. The device of claim 10, wherein the flexible circuit includes a printed circuit board (PCB).

12. The device of claim 1, further including a system fan spaced a distance from the standoff and configured to circulate air at least one of between or around the gap between the electronic component to the μ-OLED display panel.

13. The device of claim 1, further comprising a heat sink and heat pipe coupled to the electronic component, the heat sink and the heat pipe configured to dissipate heat generated by the electronic component away from the μ-OLED display panel.

14. The device of claim 1, wherein the device includes a housing, and the electronic component and the μ-OLED display panel are disposed within the housing of the device.

15. The device of claim 1, the device further comprising a graphite sheet disposed on the μ-OLED display panel, wherein the graphite sheet is configured to conduct heat generated by the μ-OLED display panel away from the μ-OLED display panel.

16. A head-mounted device comprising:
a housing;
a display assembly disposed in the housing, the display assembly comprising:
a first micro-organic light emitting diode (μ-OLED) display panel;
a first electronic component;
a first electrical connector electrically coupling the first electronic component to the first μ-OLED display panel;
a second μ-OLED display panel;
a second electronic component;
a second electrical connector electrically coupling the second electronic component to the second μ-OLED display panel;
a first U-shaped heat sink disposed in a first space between the first μ-OLED display panel and the first electronic component, the first U-shaped heat sink comprising:
a first bottom plate in contact with the first μ-OLED display panel, and
a first top plate in contact with the first electronic component, the first electrical connector coupling the first bottom plate to the first top plate; and
a second U-shaped heat sink disposed in a second space between the second μ-OLED display panel and the second electronic component, the second U-shaped heat sink comprising:

a second bottom plate in contact with the second μ-OLED display panel, and a second top plate in contact with the second electronic component, the second electrical connector coupling the second bottom plate to the second top plate; and one or more fans disposed in the housing and configured to circulate air through the first space between the first μ-OLED display panel and the first electronic component and through a second space between the second μ-OLED display panel and the second electronic component.

17. The head-mounted device of claim 16, the display assembly further comprising a system fan, wherein the system fan is configured to pull air through the first U-shaped heat sink and the second U-shaped heat sink.

18. The head-mounted device of claim 16, the display assembly further comprising:
   a first intake channel;
   a second intake channel;
   a first exhaust channel;
   a second exhaust channel,
   a system fan configured to pull air through the first intake channel before the air goes through the first U-shaped heat sink and push the air out through the first exhaust channel, and
   the system fan is configured to pull air through the second intake channel before going through the second U-shaped heat sink and push the air out through the second exhaust channel.

19. The head-mounted device of claim 16, further comprising a first system fan and a second system fan, wherein the first system fan is configured to pull air through the first U-shaped heat sink, and the second system fan is configured to pull air through the second U-shaped heat sink.

20. The head-mounted device of claim 16, further comprising:
   a first intake channel;
   a second intake channel;
   a first exhaust channel;
   a second exhaust channel;
   a first system fan is configured to pull air through the first intake channel before going through the first U-shaped heat sink and push the air out through the first exhaust channel, and
   a second system fan is configured to pull air through the second intake channel before going through the second U-shaped heat sink and push the air out through the second exhaust channel.

* * * * *